United States Patent
Choi et al.

(10) Patent No.: US 10,600,774 B2
(45) Date of Patent: Mar. 24, 2020

(54) SYSTEMS AND METHODS FOR FABRICATION OF GATED DIODES WITH SELECTIVE EPITAXIAL GROWTH

(71) Applicant: QUALCOMM Incorporated, San Diego, CA (US)

(72) Inventors: Youn Sung Choi, San Diego, CA (US); Youseok Suh, San Diego, CA (US); Kwanyong Lim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/947,114

(22) Filed: Apr. 6, 2018

(65) Prior Publication Data

US 2019/0312025 A1    Oct. 10, 2019

(51) Int. Cl.
| H01L 27/02   | (2006.01) |
| H01L 21/8238 | (2006.01) |
| H01L 29/06   | (2006.01) |
| H01L 29/66   | (2006.01) |

(52) U.S. Cl.
CPC .. *H01L 27/0255* (2013.01); *H01L 21/823821* (2013.01); *H01L 27/0292* (2013.01); *H01L 29/0638* (2013.01); *H01L 29/66356* (2013.01)

(58) Field of Classification Search
CPC .................................................. H01L 27/0255
USPC ....................................................... 257/360
See application file for complete search history.

(56) References Cited

U.S. PATENT DOCUMENTS

| 7,888,775 | B2 | 2/2011 | Russ et al. |
| 7,923,266 | B2 | 4/2011 | Thijs et al. |
| 8,143,680 | B2 | 3/2012 | Lin et al. |
| 9,612,615 | B2* | 4/2017 | Lin ....................... H01L 21/563 |
| 2011/0180925 | A1* | 7/2011 | Chandrasekaran ... H01L 23/367 257/713 |
| 2015/0255353 | A1* | 9/2015 | Wan ................. H01L 21/823814 257/369 |
| 2016/0148998 | A1* | 5/2016 | Wu ..................... H01L 29/0649 257/369 |
| 2017/0069615 | A1 | 3/2017 | Sagong et al. |
| 2017/0170264 | A1 | 6/2017 | Mauder et al. |
| 2018/0158935 | A1* | 6/2018 | Wang .................. H01L 29/7391 |

* cited by examiner

*Primary Examiner* — Jami Valentine Miller
(74) *Attorney, Agent, or Firm* — W&T/Qualcomm

(57) ABSTRACT

An integrated circuit (IC) is fabricated with transistors and gated diodes having selected epitaxial growth. The transistors may be Field-Effect Transistors (FETs) for example, and more specifically, may be fin-based FETs (finFETs) where fins are fabricated, in part, using an epitaxial growth process. The IC is further fabricated with gated diodes. Selected gated diodes within the IC are fabricated using the epitaxial growth process on the fins of the gated diode to form an anode and a cathode. Other selected gated diodes are fabricated without using epitaxial growth processes to form the anode and the cathode. In still another aspect, selected gated diodes are fabricated with epitaxial growth processes on either the anode or the cathode, but not both. In an exemplary aspect, the other selected gated diodes are part of electrostatic discharge (ESD) protection circuits in an input/output (I/O) region of the IC.

21 Claims, 26 Drawing Sheets

SYSTEMS AND METHODS FOR FABRICATION OF GATED DIODES WITH SELECTIVE EPITAXIAL GROWTH

BACKGROUND

I. Field of the Disclosure

The technology of the disclosure relates generally to gated diodes, and more particularly, to fabrication of gated diodes in integrated circuits (ICs).

II. Background

Integrated circuits (ICs) are critical components in almost all modern computing devices. Gated diodes and transistors are commonly employed in ICs. A gated diode is a device that combines the functions of a p-n junction and a metal oxide semiconductor (MOS) capacitor. A gated diode is a two-terminal device that stores a charge when a voltage above a threshold voltage is applied between the gate and the source, and negligible charge is stored otherwise. The superior conductance per unit length of a gated diode, as well as the superior turn-on speed due to the transient path of its carriers, makes the gated diode a good choice to be used in electrostatic discharge (ESD) protection circuits.

One common transistor type in an IC is a Field-Effect Transistor (FET) and, more specifically, a MOS FET (MOSFET). Many of the processes used to make MOSFETs may be used in making gated diodes. As electronic devices become more complex in functionality so does the need to include a greater number of transistors in such devices. Concurrently, there is pressure to provide the transistors in increasingly smaller sizes, particularly for portable devices such as smart phones. The increase in the number of transistors is achieved in part through continued efforts to miniaturize transistors in ICs. For example, node sizes in ICs are being scaled down by a reduction in minimum metal line width in the ICs (e.g., 65 nanometers (nm), 45 nm, 28 nm, 20 nm, etc.). As a result, gate lengths within the transistors are also scalably reduced, thereby reducing channel length of the transistors and interconnects. Reduced channel length in planar transistors has the benefit of increasing drive strength (e.g., increased drive current) and providing smaller parasitic capacitances, which results in reduced circuit delay. However, as channel length in planar transistors is reduced to the point that the channel length is of the same order of magnitude as depletion layer widths, short channel effects (SCEs) can occur that offset or otherwise degrade performance More specifically, SCEs in planar transistors cause increased current leakage, reduced threshold voltage, and/or threshold voltage roll-off (i.e., reduced threshold voltage at shorter gate lengths), and therefore, reduced gate control.

To overcome the SCEs due to the reduction in gate and channel lengths in planar transistors, "wrap around" or "gate around" transistors have been developed. One common wrap or gate around transistor is a fin-based FET (finFET), which is typically assembled into cells that are incorporated into larger ICs. Because the manufacturing of FETs is comparable to the manufacturing of gated diodes, these same fins may also be used in gated diodes. Because of the common structures, current manufacturing techniques use the same processes to make finFETs as gated diodes throughout the entirety of the IC.

Recent trends have seen the node size of FETs and gated diodes drop to and below 10 nm. Such sizes pose challenges for ICs that include both gated diodes and FETs as the techniques used to make the FETs may increase current leakage in the gated diodes.

SUMMARY OF THE DISCLOSURE

Aspects disclosed in the detailed description include systems and methods for fabrication of gated diodes with selective epitaxial growth. In an exemplary aspect, an integrated circuit (IC) is fabricated with transistors and gated diodes. The transistors may be Field-Effect Transistors (FETs) for example, and more specifically, may be fin-based FETs (finFETs) where fins are fabricated, in part, using an epitaxial growth process. The IC is further fabricated with gated diodes. Selected gated diodes within the IC are fabricated using the epitaxial growth process on the fins of the gated diode to form an anode and a cathode. Other selected gated diodes are fabricated without using epitaxial growth processes to form the anode and the cathode. In still another aspect, the other selected gated diodes are fabricated with epitaxial growth processes on either the anode or the cathode, but not both. In an exemplary aspect, the other selected gated diodes are part of electrostatic discharge (ESD) protection circuits in an input/output (I/O) region of the IC. Sub-threshold leakage current is reduced for the other selected gated diodes relative to the selected gated diodes by not using epitaxial growth processes. By reducing the sub-threshold leakage current in the I/O region, current leakage at the pins is reduced, and performance of the IC is improved.

A further exemplary aspect of the present disclosure contemplates fabricating finFETs with an epitaxial growth process on the fins while gated diodes in the same IC are fabricated with fins without using an epitaxial growth process. Alternatively in this aspect, the gated diodes may be fabricated using an epitaxial growth process on only one of the anode or cathode, but not both.

In this regard in one aspect, an IC is disclosed. The IC includes a logic region including at least one FET. The at least on FET includes a plurality of FET fins. Each of the plurality of FET fins includes a respective FET fin epitaxial bump. The IC also includes an I/O region including at least one I/O gated diode. The at least one I/O gated diode includes a plurality of diode fins. At least one of the plurality of diode fins includes a source and a drain. At least one of the source and the drain does not include an epitaxial bump.

In another aspect, an IC is disclosed. The IC includes a logic region including at least one FET. The at least one FET includes a plurality of FET fins. Each of the plurality of FET fins includes a respective means for shaping a fin. The IC also includes an I/O region including at least one I/O gated diode. The at least one I/O gated diode includes a plurality of diode fins. Each of the plurality of diode fins includes a source and a drain. At least one of the source and the drain does not include a means for shaping a fin.

In another aspect, a method for fabricating an IC is disclosed. The method includes forming a first fin for a FET in a logic region of an IC. The method also includes forming a second fin for a gated diode in an I/O region of the IC. The method also includes forming a bump using an epitaxial growth process on the first fin. The method also includes not forming an epitaxial bump on at least one of a source and a drain of the second fin.

In another aspect, an IC is disclosed. The IC includes a logic region including at least one logic gated diode. The at least one logic gated diode includes a plurality of fins. Each of the plurality of fins includes a respective fin epitaxial bump. The IC also includes an I/O region including at least one I/O gated diode. The at least one I/O gated diode includes a plurality of diode fins. At least one of the plurality of diode fins includes a source and a drain. At least one of the source and the drain does not include an epitaxial bump.

DETAILED DESCRIPTION

Figure 1:
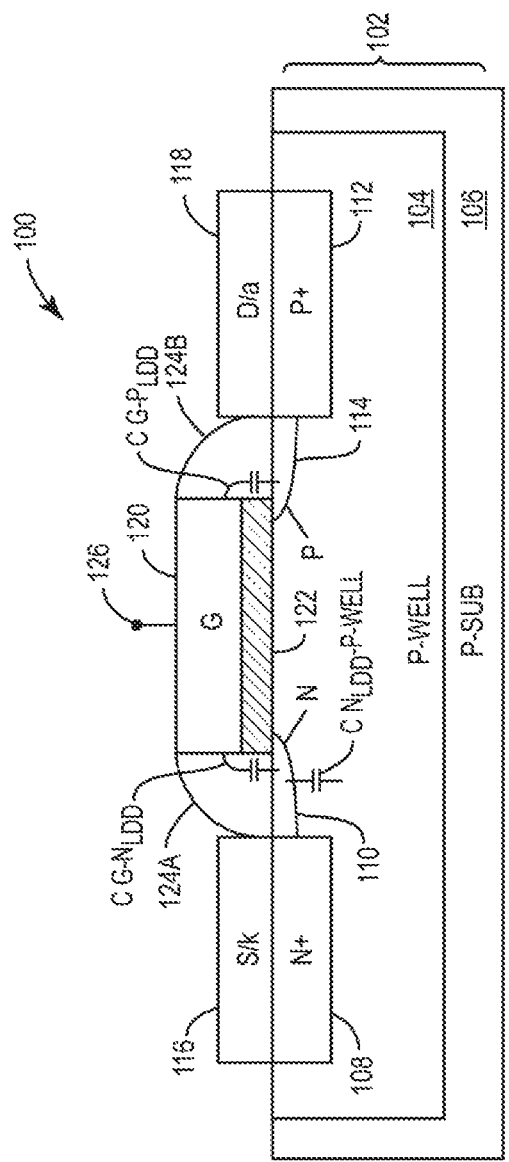
FIG. 1 is a simplified side elevational view of a gated diode.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include systems and methods for fabrication of gated diodes with selective epitaxial growth. In an exemplary aspect, an integrated circuit (IC) is fabricated with transistors and gated diodes. The transistors may be Field-Effect Transistors (FETs) for example, and more specifically, may be fin-based FETs (finFETs) where fins are fabricated, in part, using an epitaxial growth process. The IC is further fabricated with gated diodes. Selected gated diodes within the IC are fabricated using the epitaxial growth process on the fins of the gated diode to form an anode and a cathode. Other selected gated diodes are fabricated without using epitaxial growth processes to form the anode and the cathode. In still another aspect, the other selected gated diodes are fabricated with epitaxial growth processes on either the anode or the cathode, but not both. In an exemplary aspect, the other selected gated diodes are part of electrostatic discharge (ESD) protection circuits in an input/output (I/O) region of the IC. Sub-threshold leakage current is reduced for the other selected gated diodes relative to the selected gated diodes by not using epitaxial growth processes. By reducing the sub-threshold leakage current in the I/O region, current leakage at the pins is reduced, and performance of the IC is improved.

A further exemplary aspect of the present disclosure contemplates fabricating finFETs with an epitaxial growth process on the fins while gated diodes in the same IC are fabricated with fins without using an epitaxial growth process. Alternatively in this aspect, the gated diodes may be fabricated using an epitaxial growth process on only one of the anode or cathode, but not both.

Before addressing particular aspects of the present disclosure, a brief overview of a gated diode and what happens during gated diode formation when epitaxial growth is used is provided with reference to FIGS. 1-6. This explanation is provided to help contrast the selective use of epitaxial growth that is used according to exemplary aspects of the present disclosure.

In this regard, FIG. 1 illustrates a gated diode 100 having lightly doped drain (LDD) implants. The gated diode 100 is based on a metal-oxide semiconductor (MOS) design, which is also used for MOS FETs (MOSFETs). The gated diode 100 demonstrates superior forward bias conductance (e.g., 100 millisiemens/micrometer (mS/μm) of stripe length), as well as fast turn-on times (e.g., on the order of one hundred (100) picoseconds (ps) or less). As illustrated, the gated diode 100 includes a base semiconductor substrate 102 on which other materials are deposited to form the gated diode 100. The base semiconductor substrate 102 may be formed from a silicon (Si) wafer, because silicon wafers are relatively inexpensive and have well understood physical properties. Alternatively, the base semiconductor substrate 102 may be formed from another semiconducting material if desired. The base semiconductor substrate 102 may be an N-type gated diode having a P-well semiconducting material 104 forming a channel in a P-type substrate 106 (P-sub). However, the base semiconductor substrate 102 could also be a P-type gated diode having an N-well semiconducting material formed in a P-type substrate having voltages and operations complimentary to an N-type gated diode. Other variants may include a diode structure surrounded by a deep N-well that is implanted into the P-type substrate (not illustrated).

With continued reference to FIG. 1, several semiconducting sub-regions are provided in the P-well semiconducting material 104 that are tailored to form the active device region of the gated diode 100. The sub-regions may be an N+ doped region 108, an N-type LDD implant 110, a P+ doped region 112, and a P-type LDD implant 114. The N+ doped region 108 may be coupled to an electrical conductor to provide a cathode (k), or a source (S), node terminal 116 for the gated diode 100. The P+ doped region 112 may also be coupled to an electrical conductor to provide an anode (a), or a drain (D), node terminal 118 for the gated diode 100. The gated diode 100 may also include a gate (G) electrode 120 that is isolated from the P-well semiconducting material 104, the cathode node terminal 116, and the anode node terminal 118 by an insulating layer 122. The insulating layer 122 is often referred to as an oxide layer, although other insulating materials are possible. The insulating layer 122 may be of any thickness desired, but typically is very thin and may be on the order of tens of angstroms thick. The gate electrode 120 may be formed from a conventional conducting material, such as a polycrystalline silicon ("polysilicon").

With continued reference to FIG. 1, spacer regions 124A and 124B are also provided on each side of a gate terminal 126 as a result of a leftover residual insulating material placed over the gated diode 100 that was subsequently etched. The spacer regions 124A and 124B allow the N+ and P+ doped regions 108 and 112 to be formed in the P-well semiconducting material 104 after spacer formation. The N-type and P-type LDD implants 110 and 114 are formed before spacer formation.

The LDD implants 110 and 114 are used in MOSFETS to improve performance and, because gated diodes use the same manufacturing processes, the LDD implants 110 and 114 appear in gated diodes as well.

Figure 3:
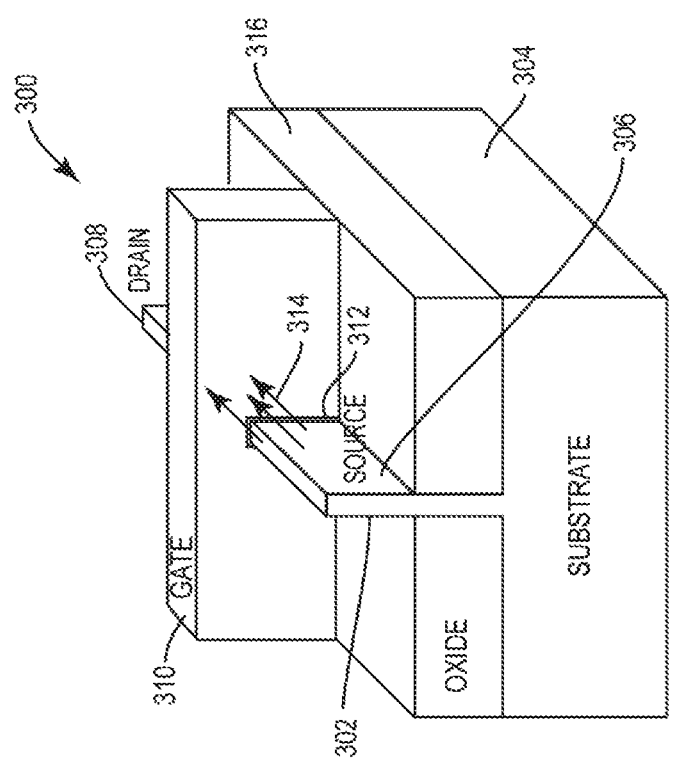
FIG. 3 is a simplified perspective view of a fin-based FET (finFET)
Figure 2:
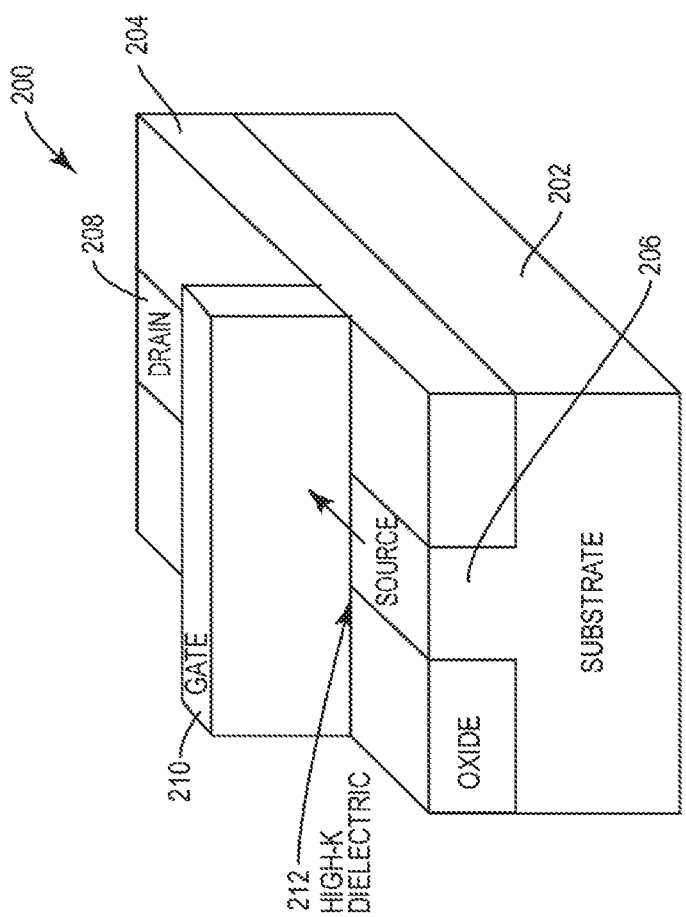
FIG. 2 is a simplified perspective view of a planar Field-Effect Transistor (FET)
Figure 4:
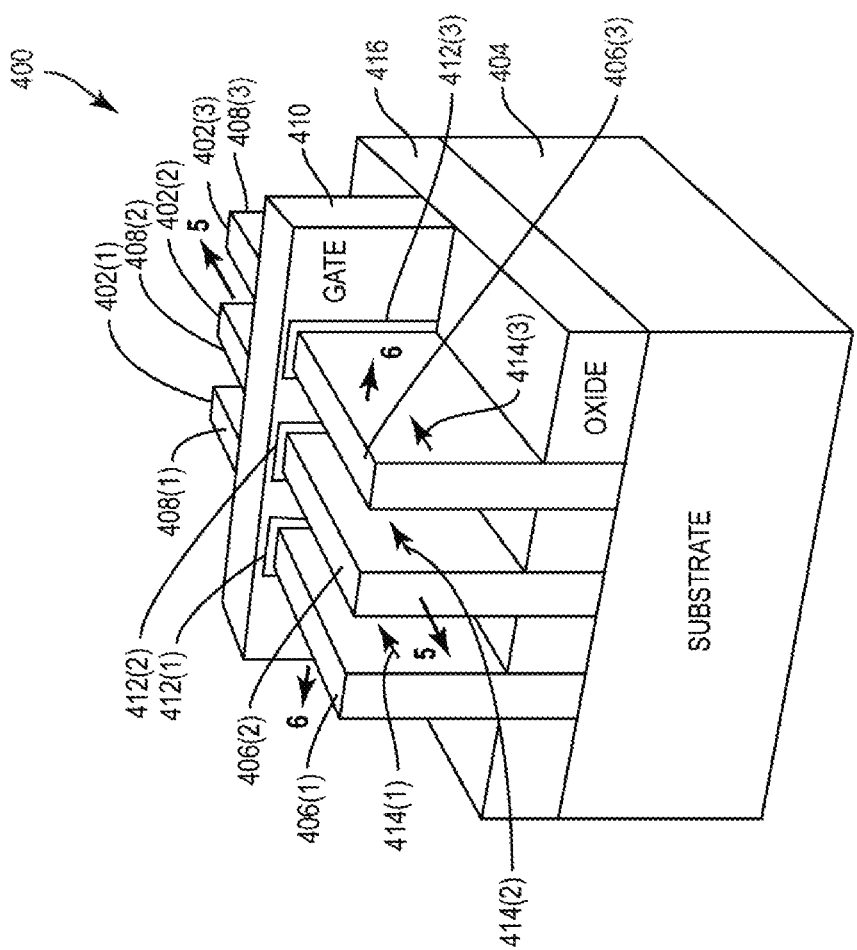
FIG. 4 is a simplified perspective view of a finFET having multiple fins.

To better understand the fins that are used in the gated diodes of the present disclosure, FIGS. 2-4 provide an evolution of a planar FET to a finFET having multiple fins. In this regard, FIG. 2 illustrates a planar transistor 200. The planar transistor 200 is formed on a substrate 202 on which an oxide layer 204 is formed. A source 206 and a drain 208 are formed on the substrate 202. A gate 210 is formed over a high-k dielectric insulator 212 over a channel (not illustrated) between the source 206 and the drain 208.

In contrast, FIG. 3 illustrates a finFET 300 having a fin 302 formed on a substrate 304. A source 306 and a drain 308 are formed in the fin 302. The fin 302 may be made of a semiconductor material such as silicon (Si). A gate 310 wraps around the fin 302 over a high-k dielectric insulator 312. A channel 314 (denoted by arrows) exists in the fin 302 between the source 306 and the drain 308. An oxide layer 316 similar to the oxide layer 204 of FIG. 2 is present on top of the substrate 304 and present on either side of the fin 302. The source 306 and the drain 308 are formed in the fin 302 on opposing sides of the gate 310. Metal contacts (not shown) may be disposed in contact with the source 306 and the drain 308 to provide respective source and drain contacts. The wrap-around structure of the gate 310 provides better electrostatic control over the channel 314, and thus, helps reduce leakage current and other short channel effects (SCEs). FinFETs such as the finFET 300 are capable of delivering high current through a small silicon footprint. Improved electrostatic control and a taller fin height enable high "ON" current for finFETs.

As node size has shrunk in ICs, the number of fins in a device has increased to provide more area for the wrap-around portion of the gate to interact with the channel to provide better channel control. In this regard, FIG. 4 illustrates a finFET 400 having multiple fins 402(1)-402(3) formed on a substrate 404. Each fin 402(1)-402(3) may have a respective source 406(1)-406(3) and a respective drain 408(1)-408(3). A gate 410 wraps around the fins 402(1)-402(3) over high-k dielectric insulators 412(1)-412(3). Respective channels 414(1)-414(3) exist in the fins 402(1)-402(3) between the sources 406(1)-406(3) and the drains 408(1)-408(3). An oxide layer 416 similar to the oxide layer 204 of FIG. 2 is present on top of the substrate 404. While multiple fins are used, in other regards, the finFET 400 is similar to the finFET 300 of FIG. 3 in operation.

Figure 6:
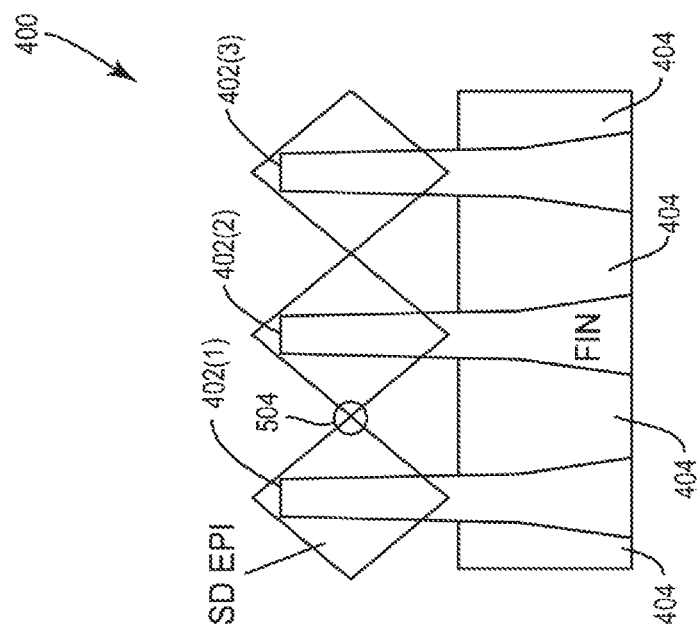
FIG. 6 is a cross-sectional view along line 6-6 of the finFET of FIG. 4 showing how epitaxial growth changes the shape of the fins.
Figure 5:
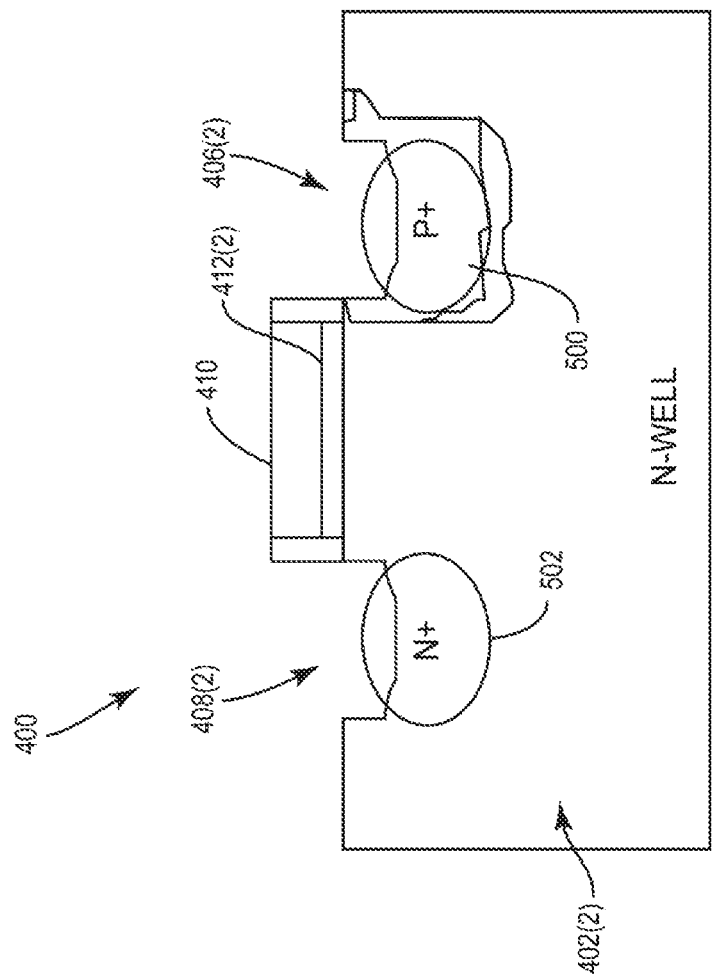
FIG. 5 is a cross-sectional view along line 5-5 of the finFET of FIG. 4 showing implantation zones of a source and a drain.

FIGS. 5 and 6 provide cross-sectional views of the finFET 400. FIG. 5 is taken along line 5-5 of FIG. 4 and FIG. 6 is taken along line 6-6 of FIG. 4. FIG. 5 illustrates how a source 406(2) and a drain 408(2) may include doping elements 500 and 502, respectively. FIG. 6 highlights what happens when epitaxial growth is used to improve the performance of the finFET 400. In particular, an epitaxial growth is applied to the fins 402(1)-402(3) causing the top of the fins 402(1)-402(3) to expand towards one another as shown by the proximity within circle 504. This increase in the area of the fins 402(1)-402(3) may be used to assist in placing contacts on the fins 402(1)-402(3), as well as, potentially, decrease the resistance so as to improve conductivity, or other reasons as is well known. In an exemplary aspect of the present disclosure, the material used for an epitaxial growth on a P-type material FET (PFET) is silicon germanium (SiGe) and the material used for an epitaxial growth on an N-type material FET (NFET) is silicon phosphorus (SiP).

The proximity of the fins 402(1)-402(3) after epitaxial growth may increase the leakage current of the finFET 400. When done for a logic element in an IC, this increase in the leakage current is tolerated as a necessary compromise to achieve other performance requirements. When done for a gated diode that is formed according to the same manufacturing processes (i.e., having fins 402(1)-402(3) and cathodes/anodes in place of source/drains) used for the finFETs of an IC, the gated diode likewise experiences leakage current.

Historically, gated diodes were manufactured at larger node sizes, and any increase in the proximity of the fins of a gated diode was believed to have negligible effect on the leakage current of the gated diode. However, current manufacturing trends have caused the node size of the gated diodes to match the node size of the logic elements within the IC. The result is that gated diodes that have such small node sizes and to which epitaxial growth is applied to the fins have leakage current levels which negatively impact the performance of the IC. The problem is acute when the gated diode is located in an I/O region of the IC proximate external pins or pads, where such leakage current may interfere with signals on those external pins or pads.

The present disclosure provides a technique through which this leakage current at gated diodes in the I/O region may be minimized In particular, the present disclosure proposes selectively applied epitaxial growth on the fins of an IC. In particular, gated diodes in the I/O region of the IC are made without using epitaxial growth while elements within the logic portion of the IC, including FETs and gated diodes therewithin, are made using epitaxial growth. As an alternative, it may be possible to apply epitaxial growth to only one of the source or the drain of gated diodes in the I/O region and still achieve some reduction in leakage current. By selectively applying the epitaxial growth to different elements, but not to the gated diodes in the I/O region of the IC, the logic elements may benefit from the presence of the larger fins while the gated diodes in the I/O region benefit from reduced leakage current, resulting in better overall performance of the IC.

Figure 7:
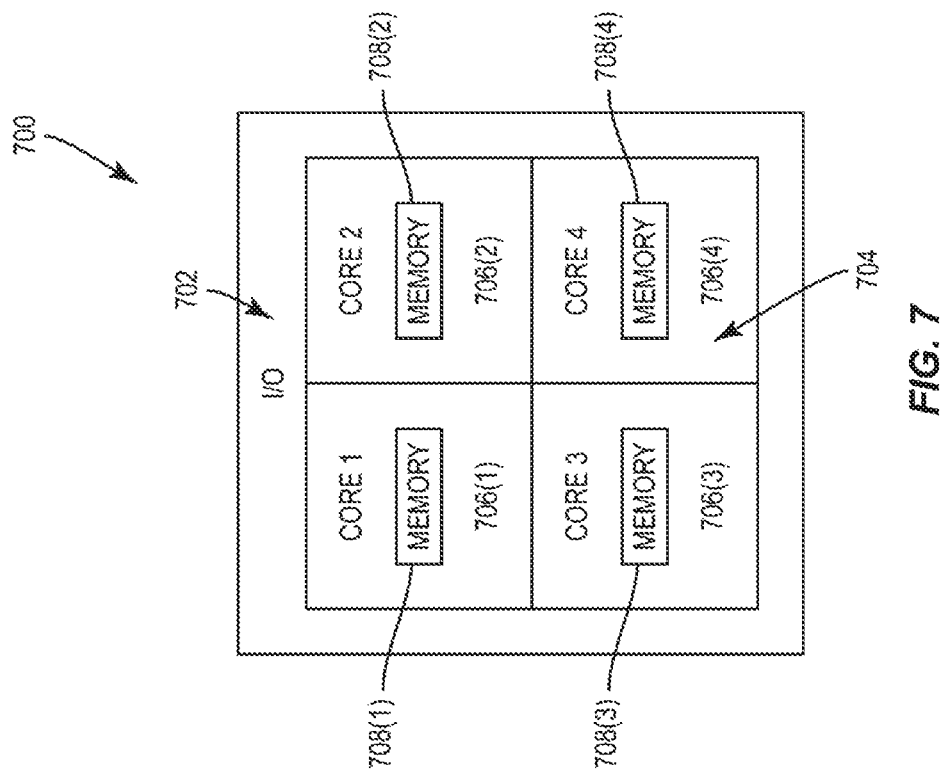
FIG. 7 is a simplified block diagram of an integrated circuit (IC) formed according to the selective epitaxial growth processes of the present disclosure.

To better understand where the different processes are used, FIG. 7 illustrates an IC 700 having an I/O region 702 and logic region 704. In practice, the I/O region 702 may be placed around a peripheral edge of the IC 700 and include one or more pins or pads allowing the IC 700 to be coupled to conductors on a printed circuit board (PCB) or the like. Also, as illustrated, the I/O region 702 surrounds the logic region 704. Other placements of the I/O region 702 and the logic region 704 within the IC 700 are possible. As used herein the I/O region 702 is defined to be the portion of the IC 700 that is associated with the input/output elements (e.g., the pins or pads) that allow signals and power to enter and exit the IC 700. The logic region 704 may include multiple processing cores 706(1)-706(4) with associated memory 708(1)-708(4). Thus, as used herein, the logic region 704 is defined to be the portion of the IC 700 that has processing elements that execute instructions or otherwise manipulate data for enablement of functions within the IC 700. The I/O region 702 may include a plurality of gated diodes (not illustrated in FIG. 7), and, optionally, one or more bipolar junction transistors (BJTs) (not illustrated), and, optionally, one or more FETs (not illustrated). The processing cores 706(1)-706(4) may include one or more gated diodes (not illustrated), one or more BJTs (not illustrated), and a plurality of logic elements made from FETs (not illustrated).

Figure 8A:
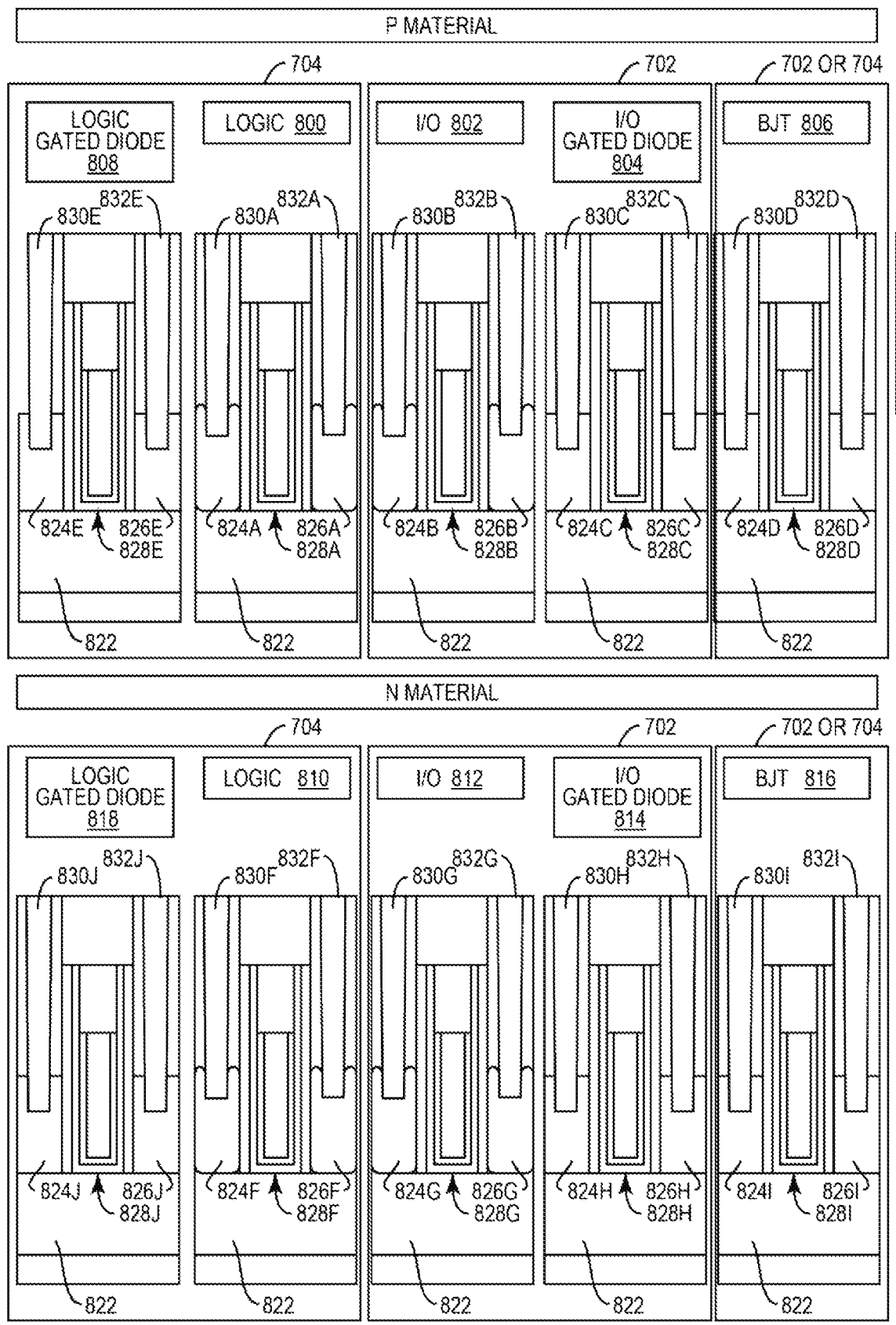
FIG. 8A is a simplified representation of cross-sectional views (analogous to the view of FIG. 5) of various P-type material elements and N-type material elements from within the IC of FIG. 7 placed side by side for comparison purposes.
Figure 8B:
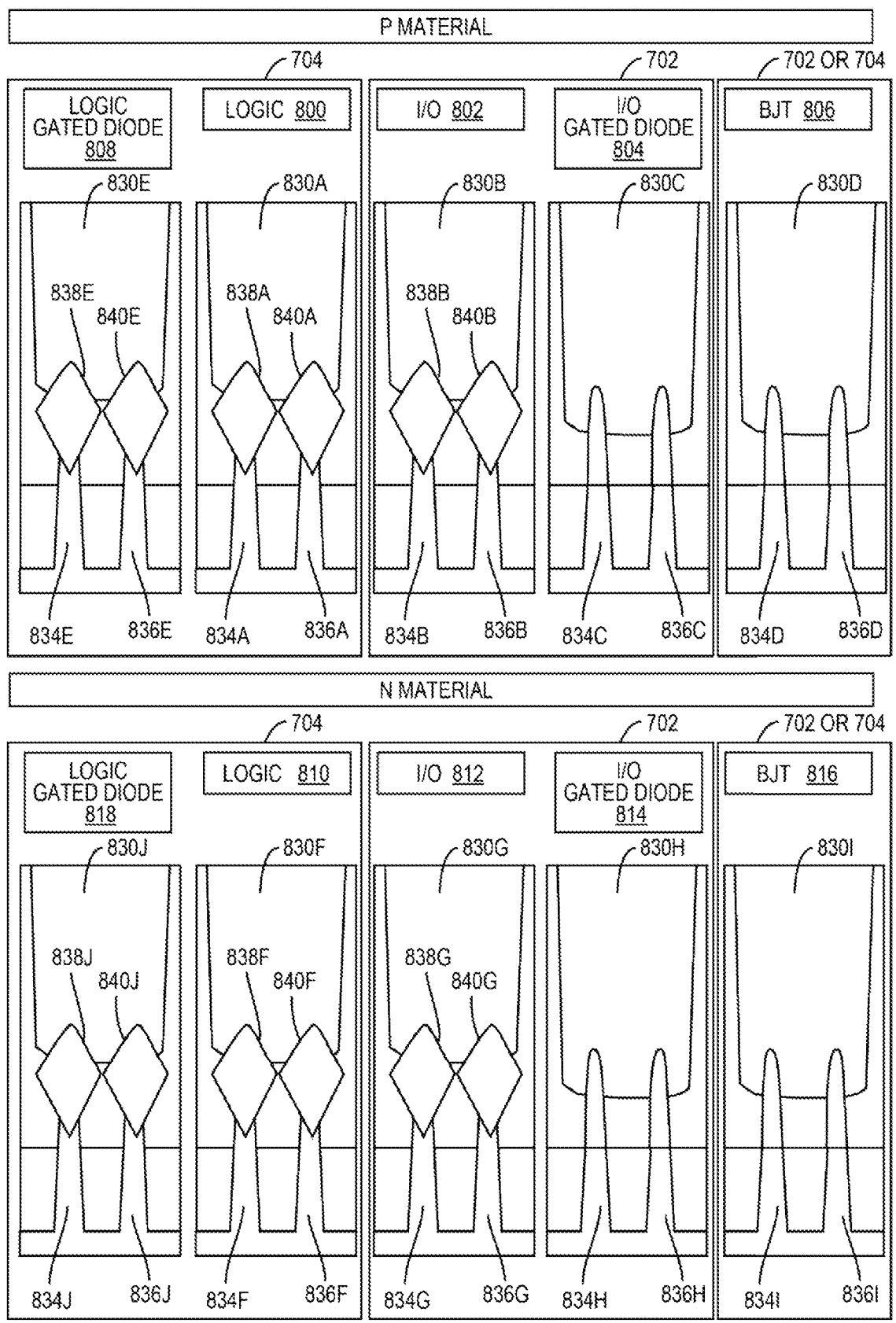
FIG. 8B is a simplified representation of cross-sectional views (analogous to the view of FIG. 6) of various P-type material elements and N-type material elements from within the IC of FIG. 7 placed side by side for comparison purposes.

FIGS. 8A and 8B provide cross-sectional views of various elements within the IC 700 of FIG. 7. In particular, FIG. 8A is a cross-sectional view along an axis of a gate of an element (analogous to FIG. 5), and FIG. 8B is a cross-sectional view along an axis perpendicular to the axis of the gate (analogous to FIG. 6). In this regard, the various P-type material elements are a logic element transistor 800, an I/O transistor 802, an I/O gated diode 804, a BJT 806, and a logic gated diode 808. The various N-type material elements are a logic element transistor 810, an I/O transistor 812, an I/O gated diode 814, a BJT 816, and a logic gated diode 818. It should be appreciated that the logic element transistors 800 and 810 are present in the logic region 704 of FIG. 7. Further, the I/O transistors 802 and 812 are transistors that are present in the I/O region 702. The I/O gated diodes 804 and 814 are present in the I/O region 702. The BJTs 806 and 816 are present in both the I/O region 702 and the logic region 704. The logic gated diodes 808 and 818 are present in the logic region 704.

With continued reference to FIGS. 8A and 8B, each P-type material element has a substrate 822. The logic element transistor 800 has a P-type source implant 824A and a P-type drain implant 826A. The logic element transistor 800 further has a gate structure 828A positioned between the source implant 824A and the drain implant 826A. A contact 830A conductively couples to the source implant 824A, and a contact 832A conductively couples to the drain implant 826A.

Similarly, the I/O transistor 802 has a P-type source implant 824B and a P-type drain implant 826B. The I/O transistor 802 further has a gate structure 828B positioned between the source implant 824B and the drain implant 826B. A contact 830B conductively couples to the source implant 824B, and a contact 832B conductively couples to the drain implant 826B.

Similarly, the I/O gated diode 804 has a P-type source implant 824C and an N-type drain implant 826C. The I/O gated diode 804 further has a gate structure 828C positioned between the source implant 824C and the drain implant 826C. A contact 830C conductively couples to the source implant 824C, and a contact 832C conductively couples to the drain implant 826C. The source implant 824C and the drain implant 826C act as an anode and a cathode, respectively, for the I/O gated diode 804 and thereby form a p-n junction.

Similarly, the BJT 806 has a P-type collector implant 824D and a P-type emitter implant 826D. The BJT 806 further has a base structure 828D positioned between the collector implant 824D and the emitter implant 826D. A contact 830D conductively couples to the collector implant 824D, and a contact 832D conductively couples to the emitter implant 826D. In general, the BJT 806 is not bound by the same node size as used for FETs in the IC 700.

Similarly, the logic gated diode 808 has a P-type source implant 824E and an N-type drain implant 826E. The logic gated diode 808 further has a gate structure 828E positioned between the source implant 824E and the drain implant 826E. A contact 830E conductively couples to the source implant 824E, and a contact 832E conductively couples to the drain implant 826E. The source implant 824E and the drain implant 826E act as an anode and a cathode, respectively, for the logic gated diode 808 and thereby form a p-n junction.

The N-type material elements are similar, but instead of implanting P-type material to form source and drain regions, N-type material is used. In this regard, the logic element transistor 810 has an N-type source implant 824F and an N-type drain implant 826F. The logic element transistor 810 further has a gate structure 828F positioned between the source implant 824F and the drain implant 826F. A contact 830F conductively couples to the source implant 824F, and a contact 832F conductively couples to the drain implant 826F.

Similarly, the I/O transistor 812 has an N-type source implant 824G and an N-type drain implant 826G. The I/O transistor 812 further has a gate structure 828G positioned between the source implant 824G and the drain implant 826G. A contact 830G conductively couples to the source implant 824G, and a contact 832G conductively couples to the drain implant 826G.

Similarly, the I/O gated diode 814 has an N-type source implant 824H and a P-type drain implant 826H. The I/O gated diode 814 further has a gate structure 828H positioned between the source implant 824H and the drain implant 826H. A contact 830H conductively couples to the source implant 824H, and a contact 832H conductively couples to the drain implant 826H. The source implant 824H and the drain implant 826H act as a cathode and an anode, respectively, for the I/O gated diode 814 and thereby form a p-n junction.

Similarly, the BJT 816 has an N-type collector implant 824I and an N-type emitter implant 826I. The BJT 816 further has a base structure 828I positioned between the collector implant 824I and the emitter implant 826I. A contact 830I conductively couples to the collector implant 824I, and a contact 832I conductively couples to the emitter implant 826I. In general, the BJT 816 is not bound by the same node size as used for FETs in the IC 700.

Similarly, the logic gated diode 818 has a N-type source implant 824J and an P-type drain implant 826J. The logic gated diode 818 further has a gate structure 828J positioned between the source implant 824J and the drain implant 826J. A contact 830J conductively couples to the source implant 824J, and a contact 832J conductively couples to the drain implant 826J. The source implant 824J and the drain implant 826J act as a cathode and an anode, respectively, for the logic gated diode 818 and thereby form a p-n junction.

The views provided in FIG. 8A do little to illustrate the differences in the various elements. However, FIG. 8B shows the same elements along a different cross-sectional axis and, more interestingly, shows the fins of the respective elements and whether or not the fins have had epitaxial growth used to modify the shape of the fins. In particular, the contacts 830A-830J are conductively coupled to fins 834A-834J, respectively, and 834A-836J, respectively. As noted above, aspects of the present disclosure do not apply epitaxial growth to the fins 834C, 836C, 834H, and 836H for the I/O gated diodes 804 and 814. Other gated diodes, such as the logic gated diodes 808 and 818 do have epitaxial growth applied, causing epitaxial bumps 838E, 840E, 838J, and 840J to form. The logic element transistors 800 and 810 as well as the I/O transistors 802 and 812 also have epitaxial growth applied, causing epitaxial bumps 838A, 840A, 838B, 840B, 838F, 840F, 838G, and 840G to form. As used herein, the term epitaxial bump may also be referred to as a means for shaping a fin.

Figure 9:
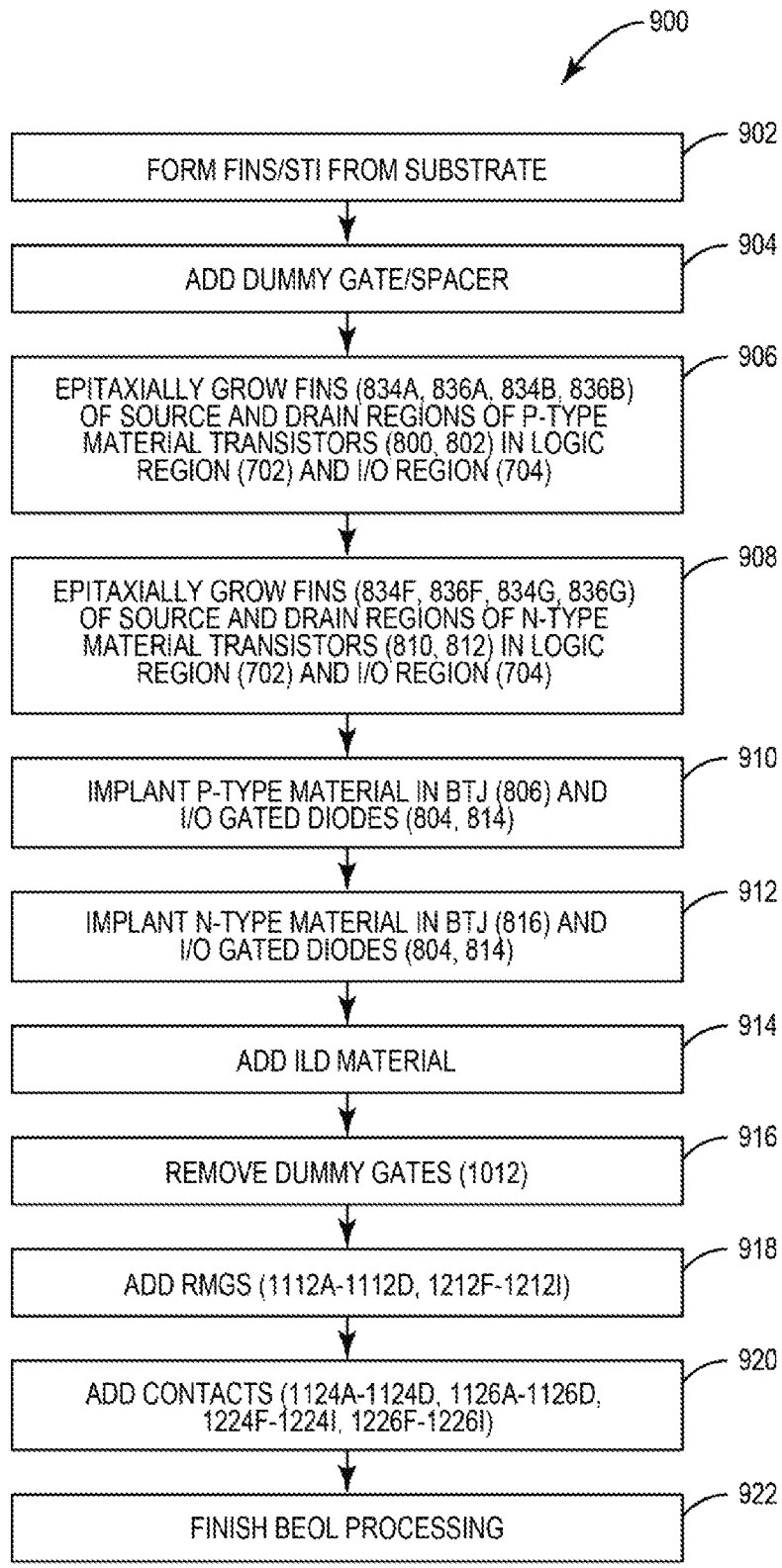
FIG. 9 is a flowchart illustrating an exemplary process for forming elements within the IC of FIG. 7 with selective use of epitaxial growth.

FIG. 9 illustrates a process 900 for making the IC 700 of FIG. 7. The process 900 is better understood with reference to FIG. 10, which illustrates fin formation in the process 900, FIGS. 11A-11H, which illustrate individual steps of the process 900 for P-type material elements, and FIGS. 12A-12H, which illustrate individual steps of the process 900 for N-type material elements. Thus, as process 900 is explained, reference will be made to FIGS. 10, 11A-11H, and 12A-12H as appropriate.

Figure 10:
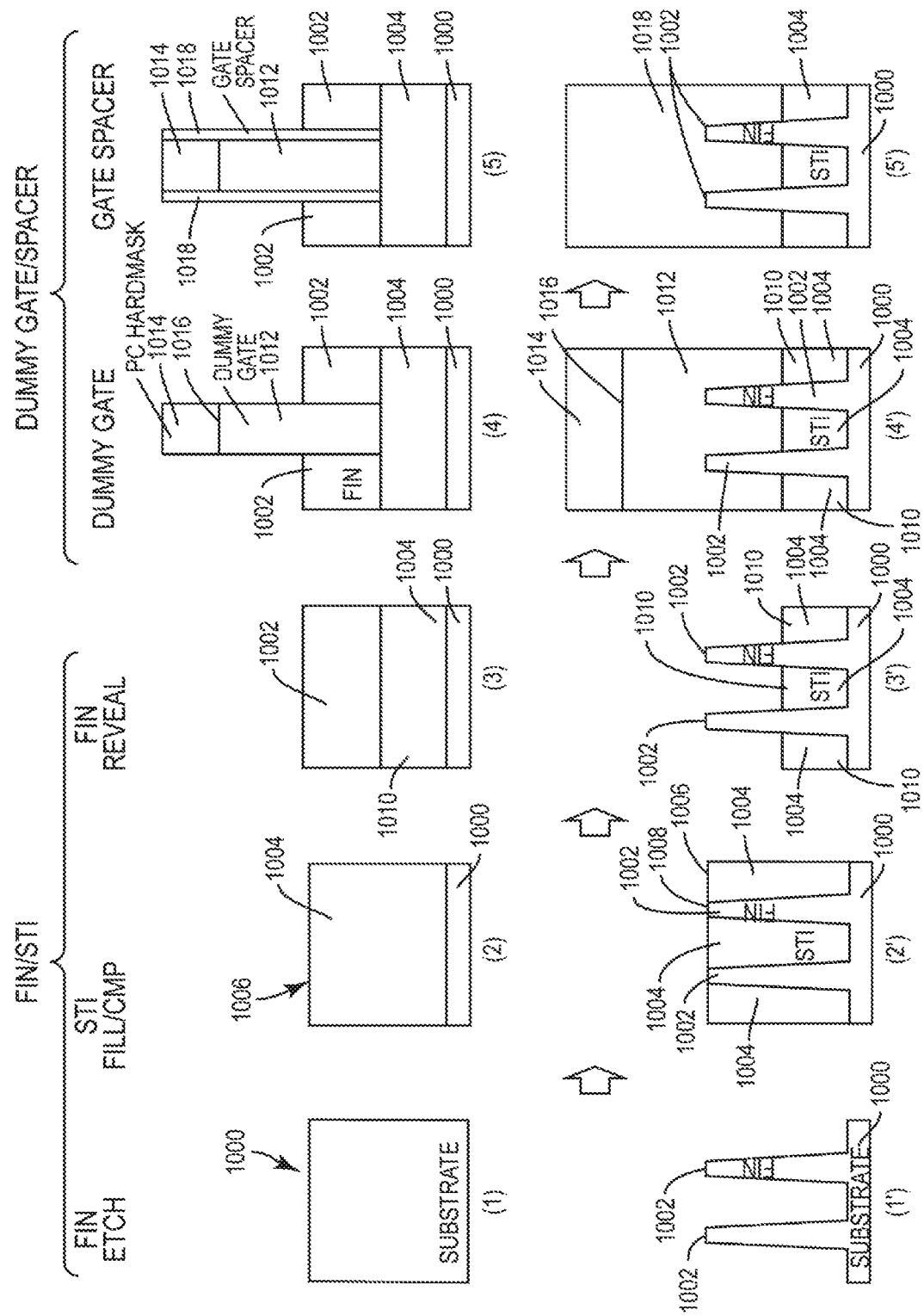
FIG. 10 illustrates fin formation for the IC of FIG. 7 according to the process of FIG. 9.

In this regard, the process 900 begins by forming fins and a shallow trench isolation (STI) from a substrate (block 902). FIG. 10 illustrates the formation of the fins from a substrate 1000. As illustrated, views (1)-(5) are cross-sectional views along the same axis as the view in FIG. 8A, and views (1')-(5') are cross-sectional views along the same axis as the view in FIG. 8B. In stage 1, a substrate 1000 is etched to form fins 1002. The substrate 1000 may be a silicon material or the like. In stage 2, an STI material 1004 is added. The STI material 1004 may be an oxide material or other dielectric material. The STI material 1004 fills the space between and around the fins 1002. A chemical mechanical polish (CMP) may be applied to cause a top surface 1006 of the STI material 1004 to be even with a top surface 1008 of the fins 1002. In stage 3, the STI material 1004 is removed, such as through an etching process to reveal the fins 1002 but leave STI regions 1010 between the fins 1002.

Once the STI regions 1010 have been formed, a gate, which may be a dummy gate and gate spacer material, is added (block 904). Thus, in stage 4, a gate 1012, which may be a dummy gate, is added. The gate 1012 may have a hardmask 1014 positioned on a top surface 1016. In stage 5, a gate spacer 1018 is added to the gate 1012. The gate spacer 1018 may be a dielectric or other insulator material.

At this point, the process bifurcates slightly depending on whether the device being made is an N-type material device or a P-type material device. Accordingly, subsequent steps are illustrated in FIGS. 11A-H and 12A-H based on material type. Note further that the generic components FIG. 10 identified by reference numbers in the 1000s are replaced with the reference numbers from FIG. 8. The process 900 continues by epitaxially growing the fins 834A, 836A, 834B, and 836B of the source and drain regions of the P-type material transistors 800 and 802 in the logic region 704 and the I/O region 702 (block 906, see FIGS. 11A and 12A). Note that while not illustrated, any logic gated diode 808 in the logic region 704 is treated like the transistors 800 and 802 in that the epitaxial growth is applied to the fins 834E and 836E of the logic gated diode 808. Thus, with reference to FIG. 11A, epitaxial bumps 838A and 840A grow on the fins 834A and 836A, respectively, and epitaxial bumps 838B and 840B grow on the fins 834B and 836B, respectively. The epitaxial bumps 838A, 838B, 840A, and 840B are made of a P-type material. Conversely, the remaining fins 834C-834D, 834F-834I, 836C-834D, and 836F-836I have a respective hardmask or block mask 1100C, 1100D, and 1200E-1200I used to prevent epitaxial growth thereon.

Figure 11A:
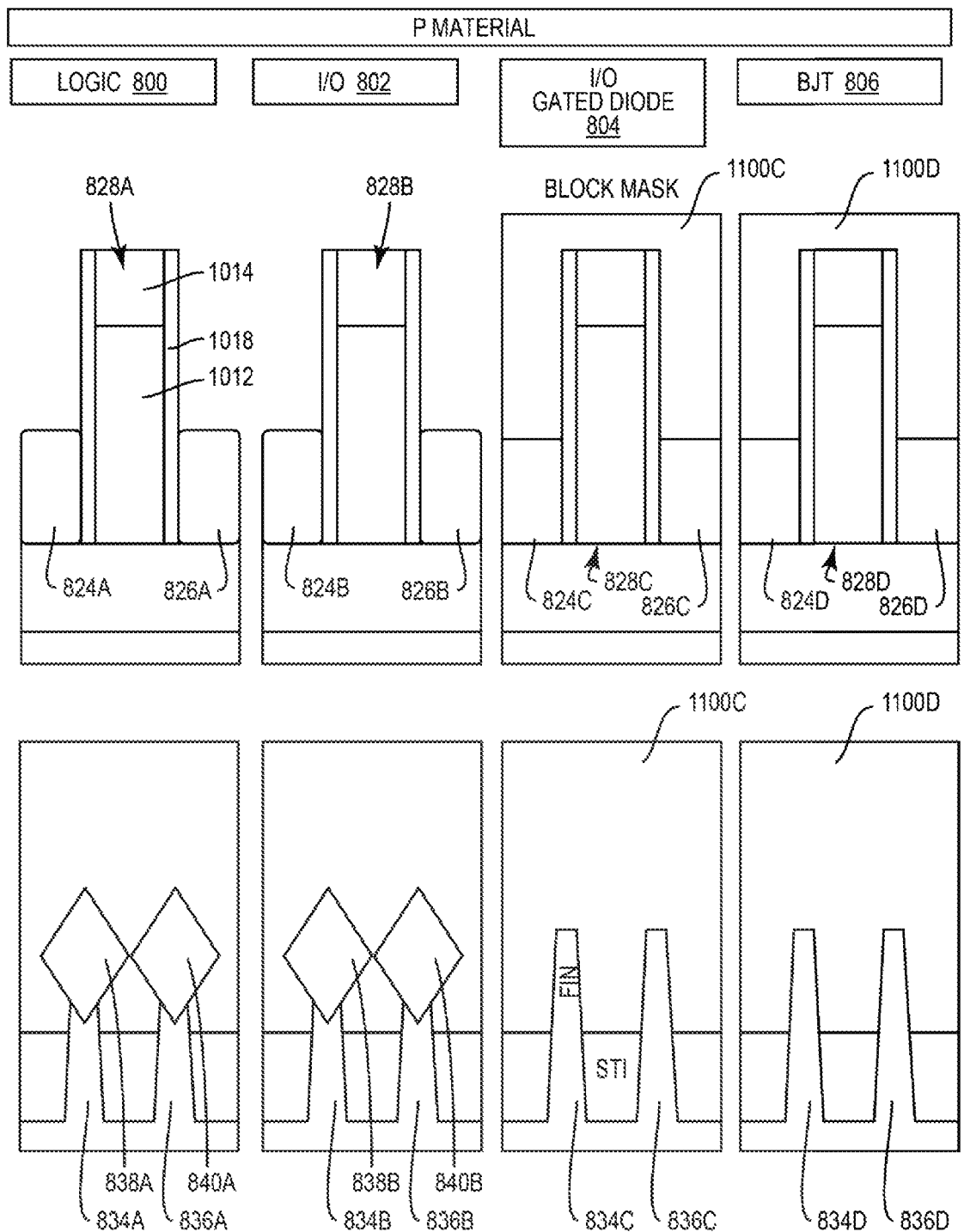
FIGS. 11A-11H illustrate the process stages of P-type material elements made according to the process of FIG. 9.
Figure 11B:
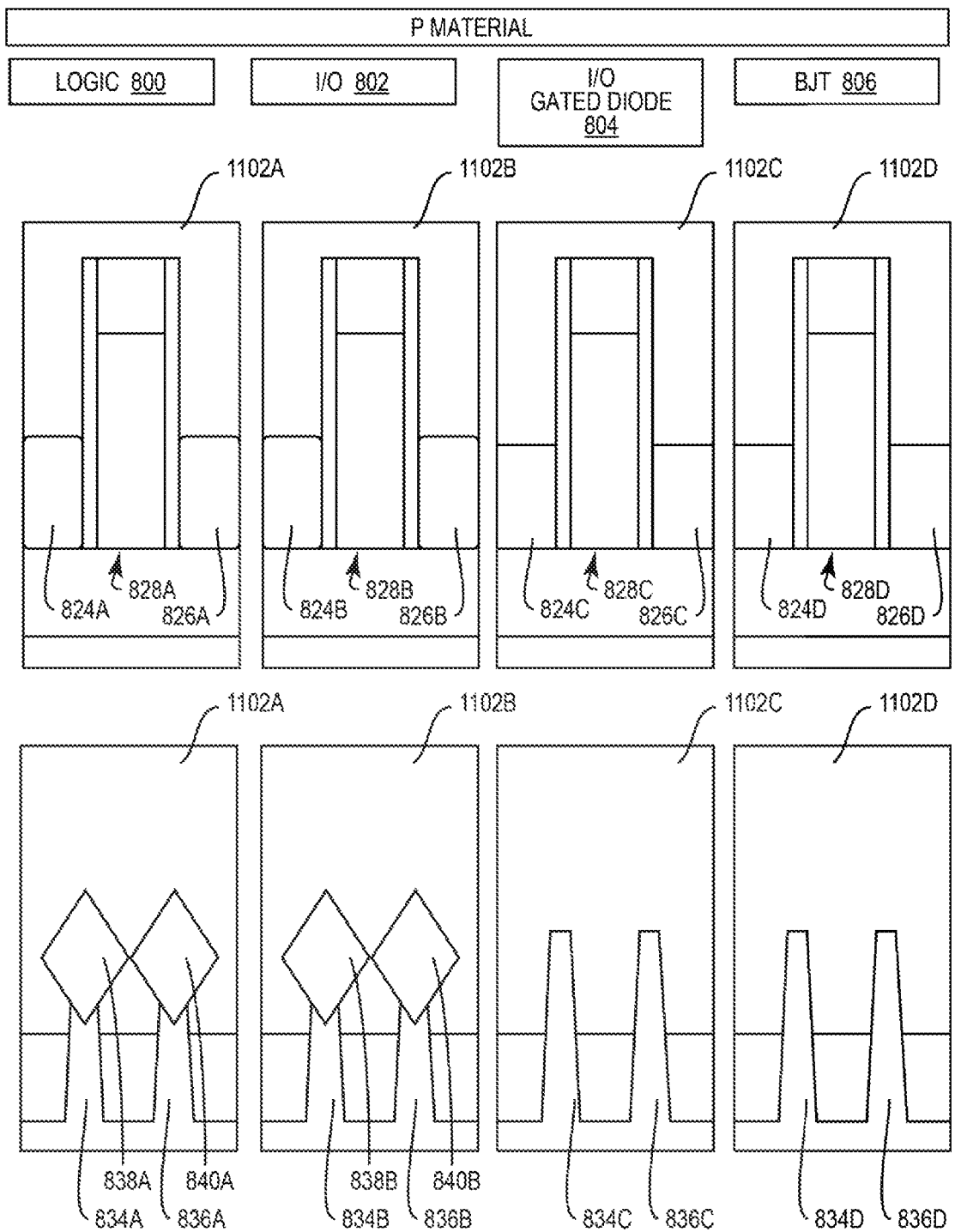
Figure 12A:
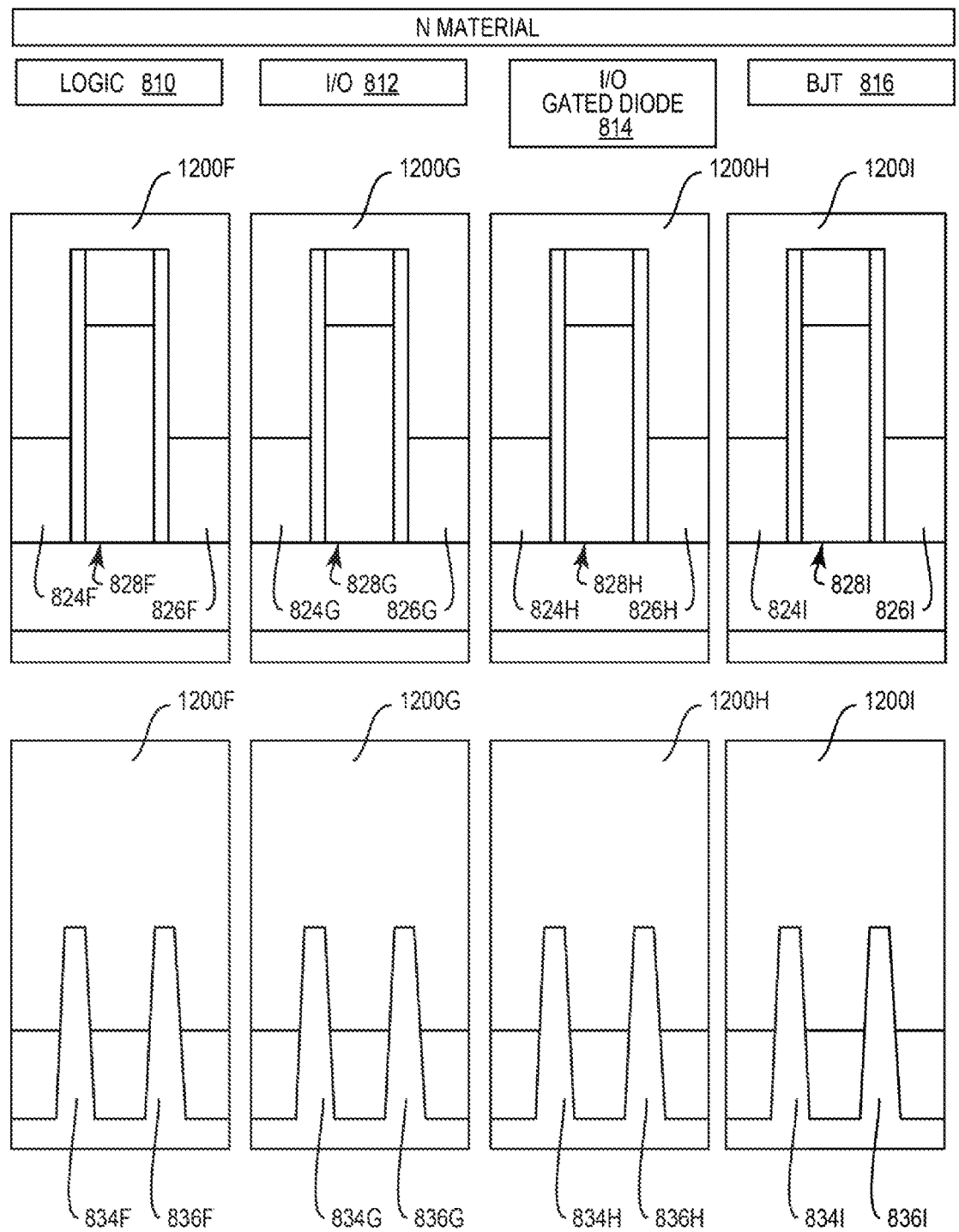
FIGS. 12A-12H illustrate the process stages of N-type material elements made according to the process of FIG. 9.
Figure 12B:
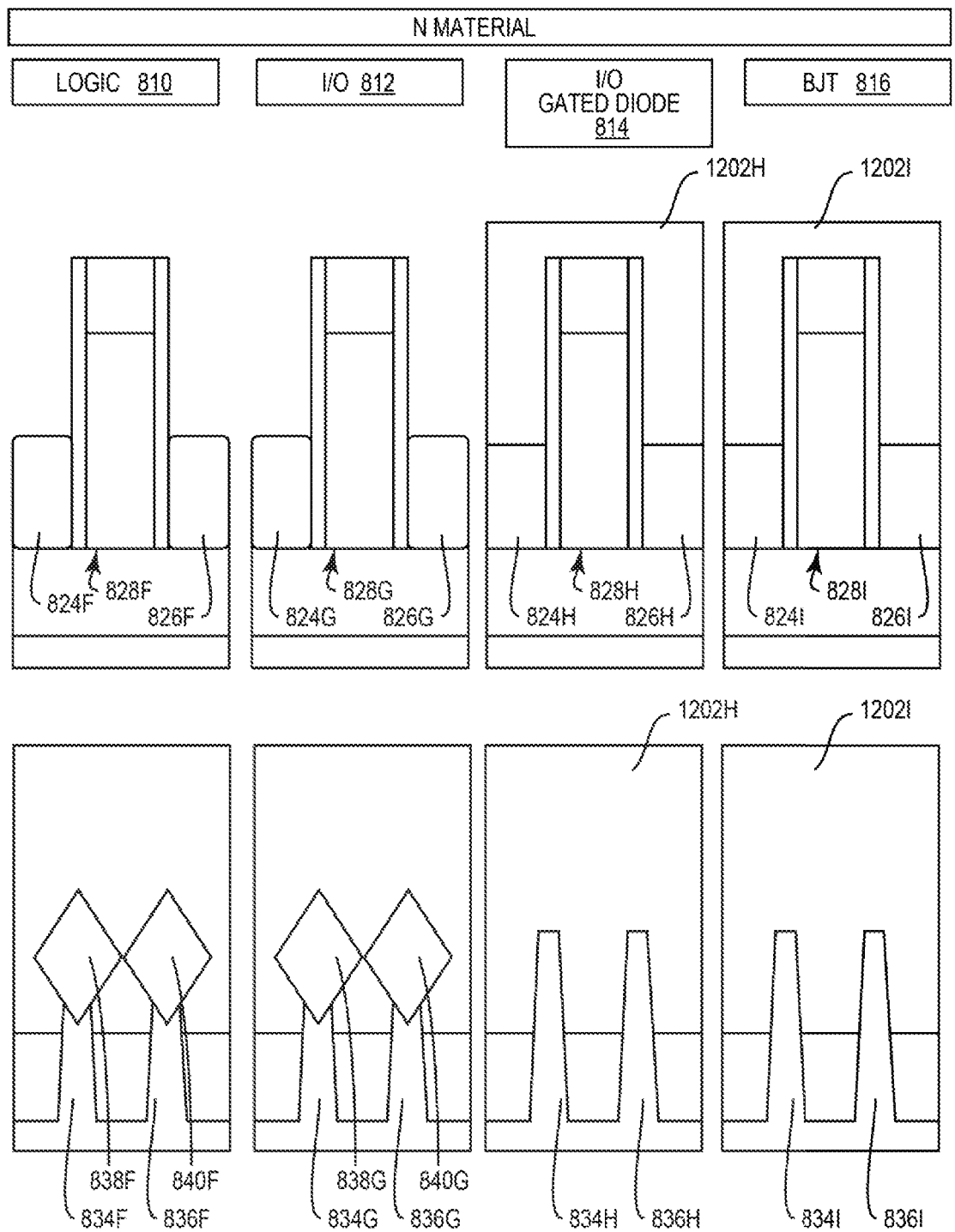

The process 900 continues by epitaxially growing the fins 834F, 836F, 834G, and 836G of the source and drain regions of the N-type material transistors 810 and 812 in the logic region 704 and the I/O region 702 (block 908, see FIGS. 11B and 12B). Note that while not illustrated, any logic gated diode 818 in the logic region 704 is treated like the transistors 810 and 812 in that the epitaxial growth is applied to the fins 834J and 836J of the logic gated diode 818. Thus, with reference to FIG. 12B, epitaxial bumps 838F and 840F grow on the fins 834F and 836F, respectively, and epitaxial bumps 838G and 840G grow on the fins 834G and 836G, respectively. The epitaxial bumps 838F, 838G, 840F, and 840G are made of an N-type material. Conversely, the remaining fins 834A-834D, 834H-834I, 836C-834D, and 836F-836I have a respective hardmask or block mask 1102A-1102D and 1202H-1202I used to prevent epitaxial growth thereon.

Figure 11C:
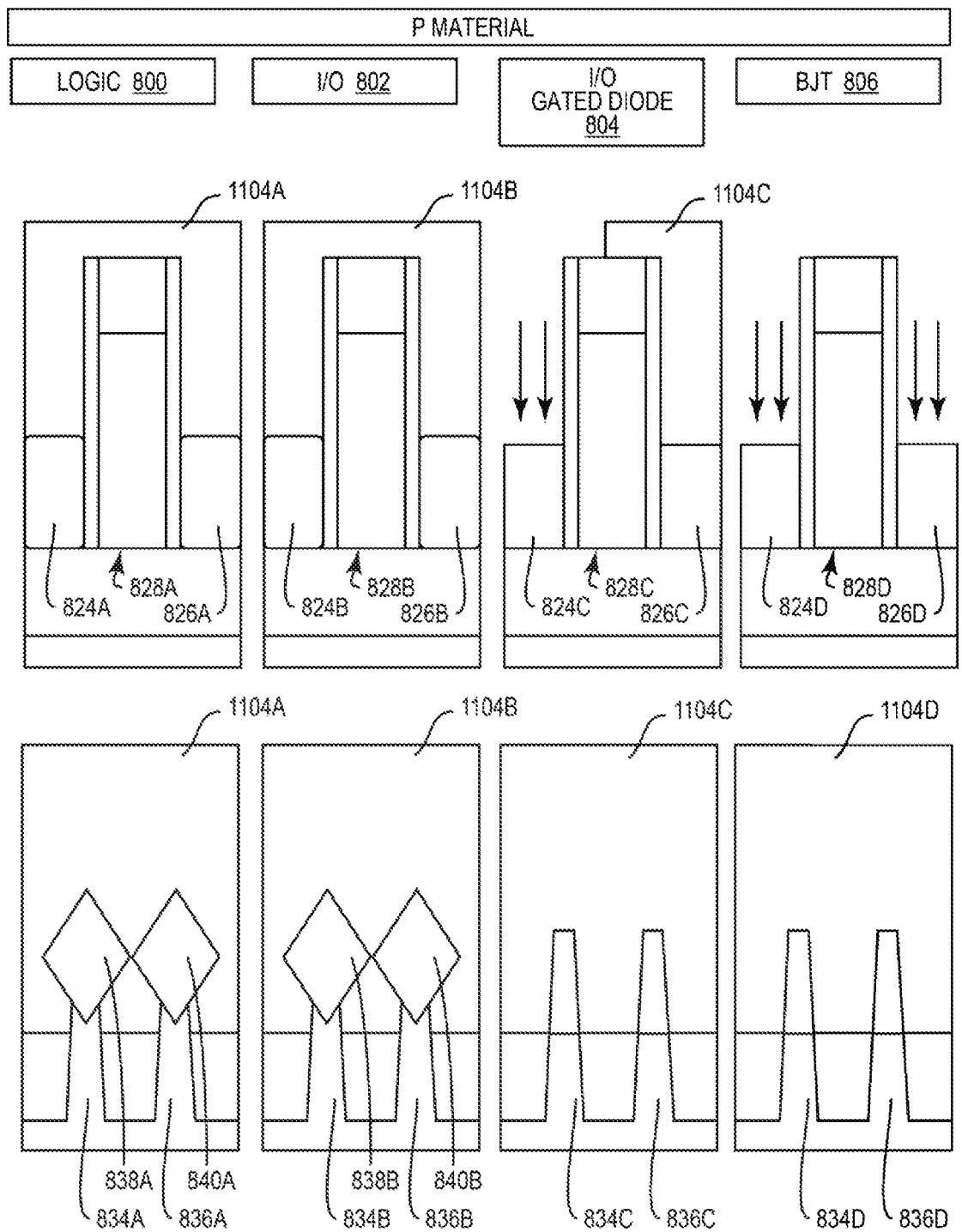
Figure 12C:
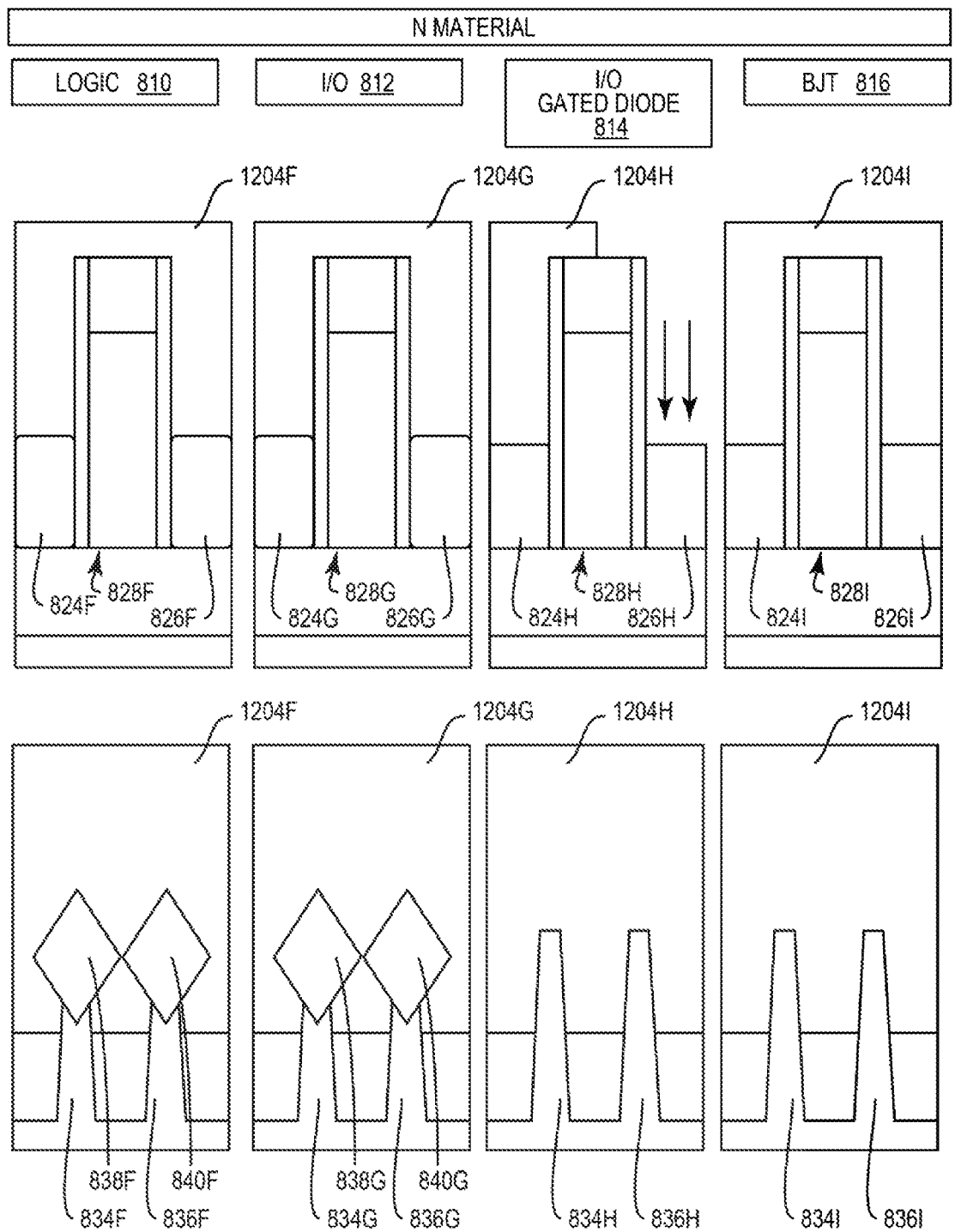

Returning to FIG. 9, the process 900 continues by implanting a P-type material in the BJT 806 and the I/O gated diodes 804 and 814 (block 910, see FIGS. 11C and 12C). This step creates P regions 824C, 824D, 826D, and 826H. Block masks 1104A, 1104B, 1204F, 1204G, and 1204I are used to mask the respective elements completely during this implantation step. Partial block masks 1104C and 1204H are used with the I/O gated diodes 804 and 814 to allow implantation.

Figure 11D:
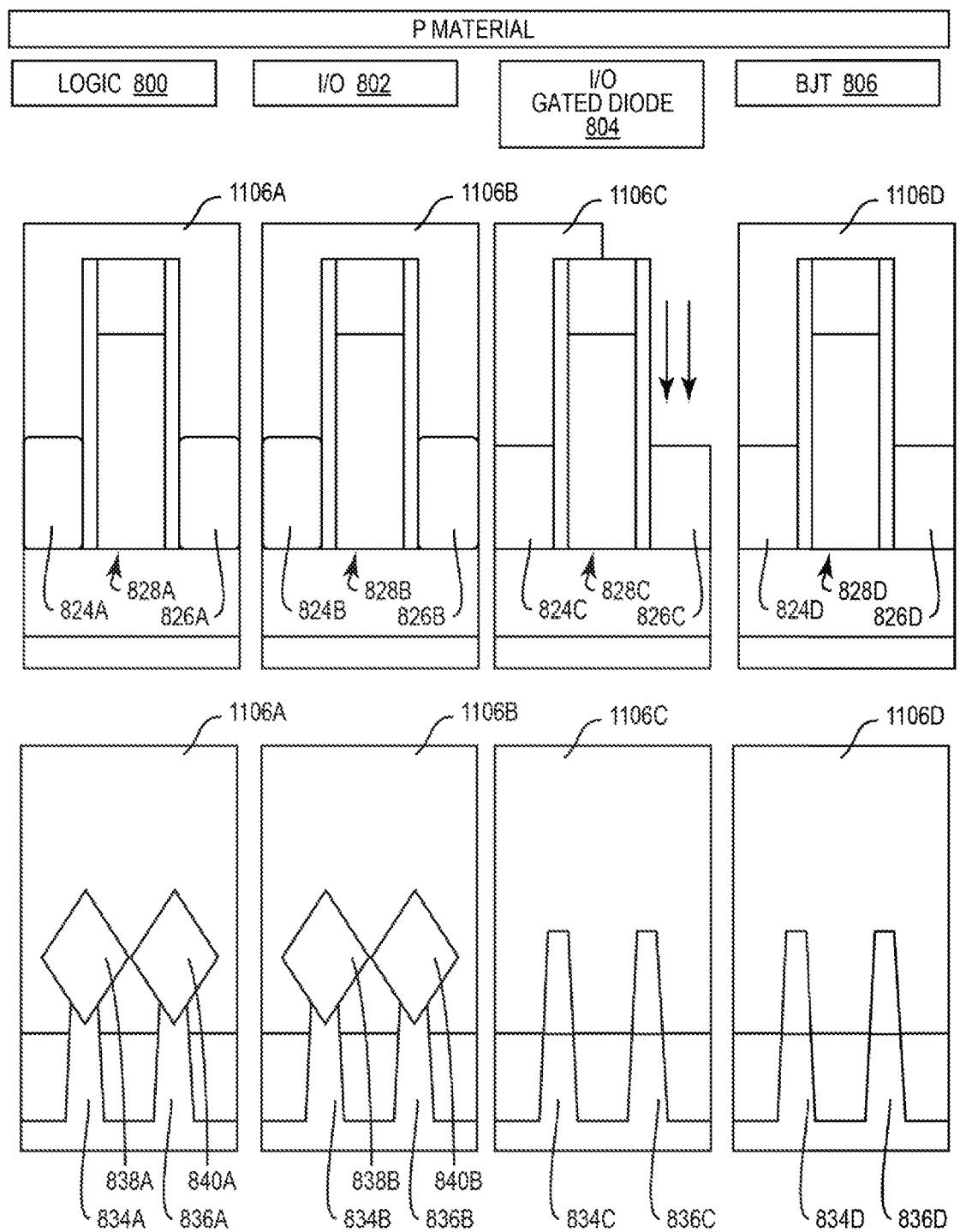
Figure 12D:
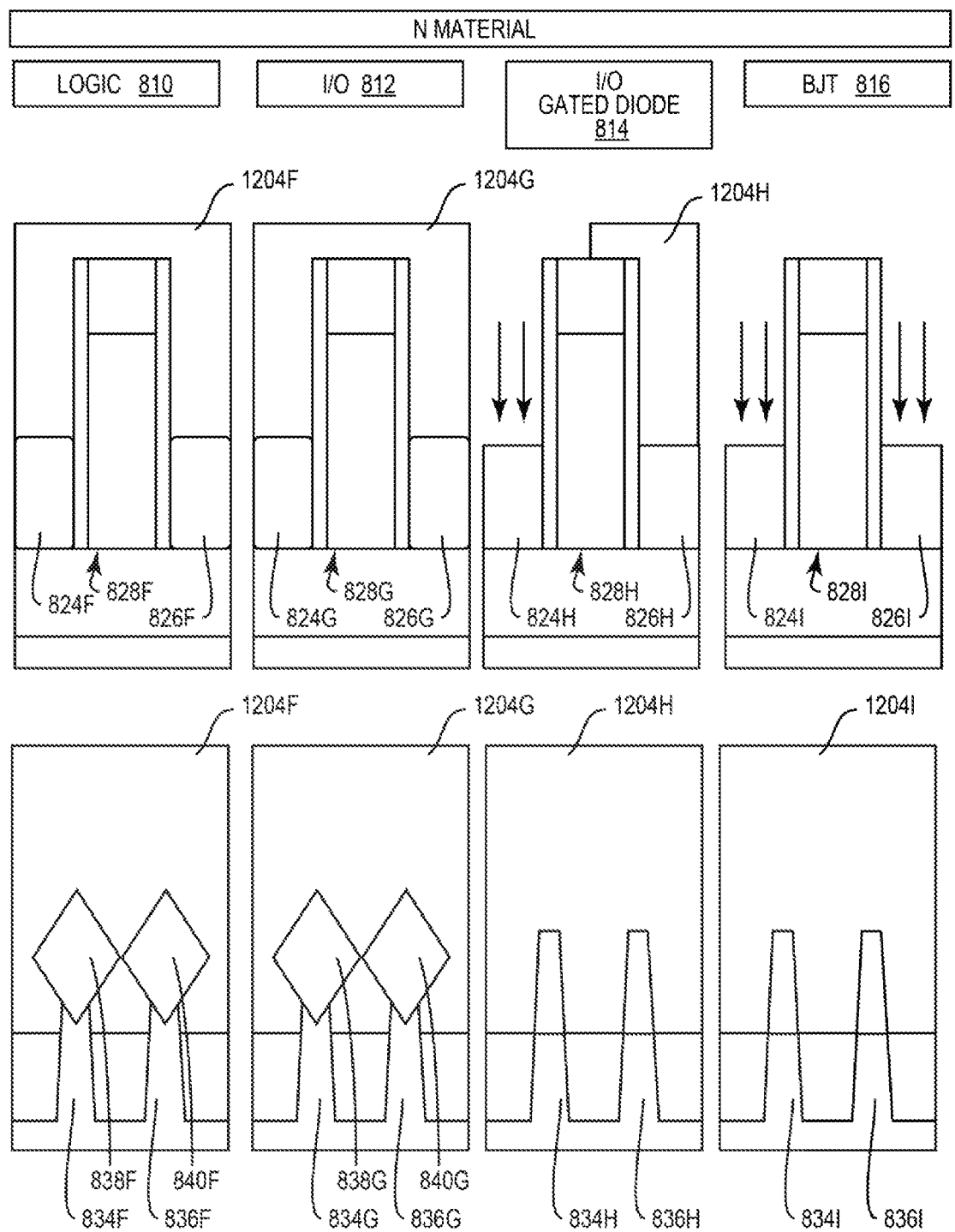

Returning to FIG. 9, the process 900 continues by implanting an N-type material in the BJT 816 and the I/O gated diodes 804 and 814 (block 912, see FIGS. 11D and 12D). This step creates N regions 826C, 824H, 824I, and 826I. Block masks 1106A, 1106B, 1106D, 1206F, and 1206G are used to mask the respective elements completely during this implantation step. Partial block masks 1106C and 1206H are used with the I/O gated diodes 804 and 814 to allow implantation.

Figure 11E:
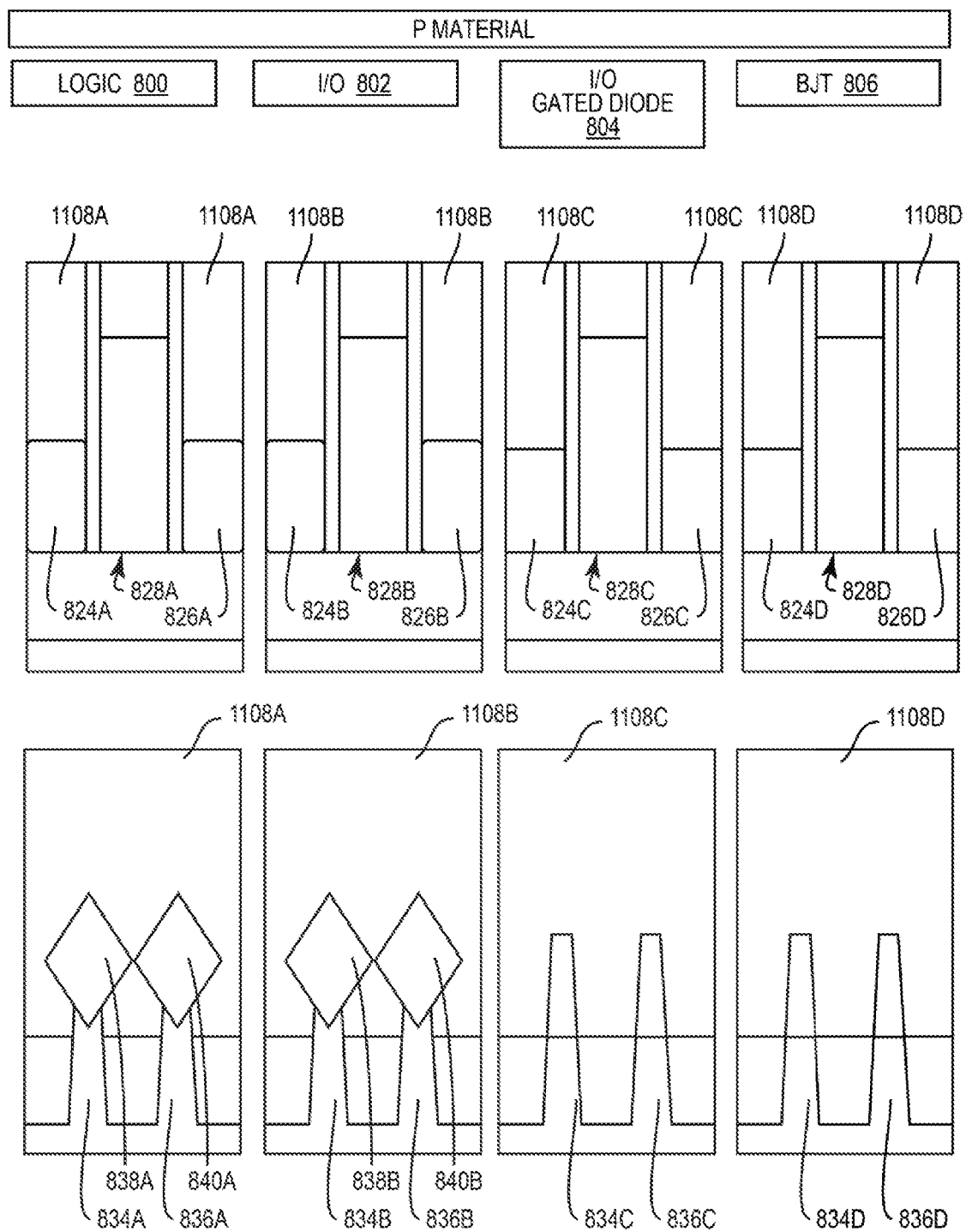
Figure 11F:
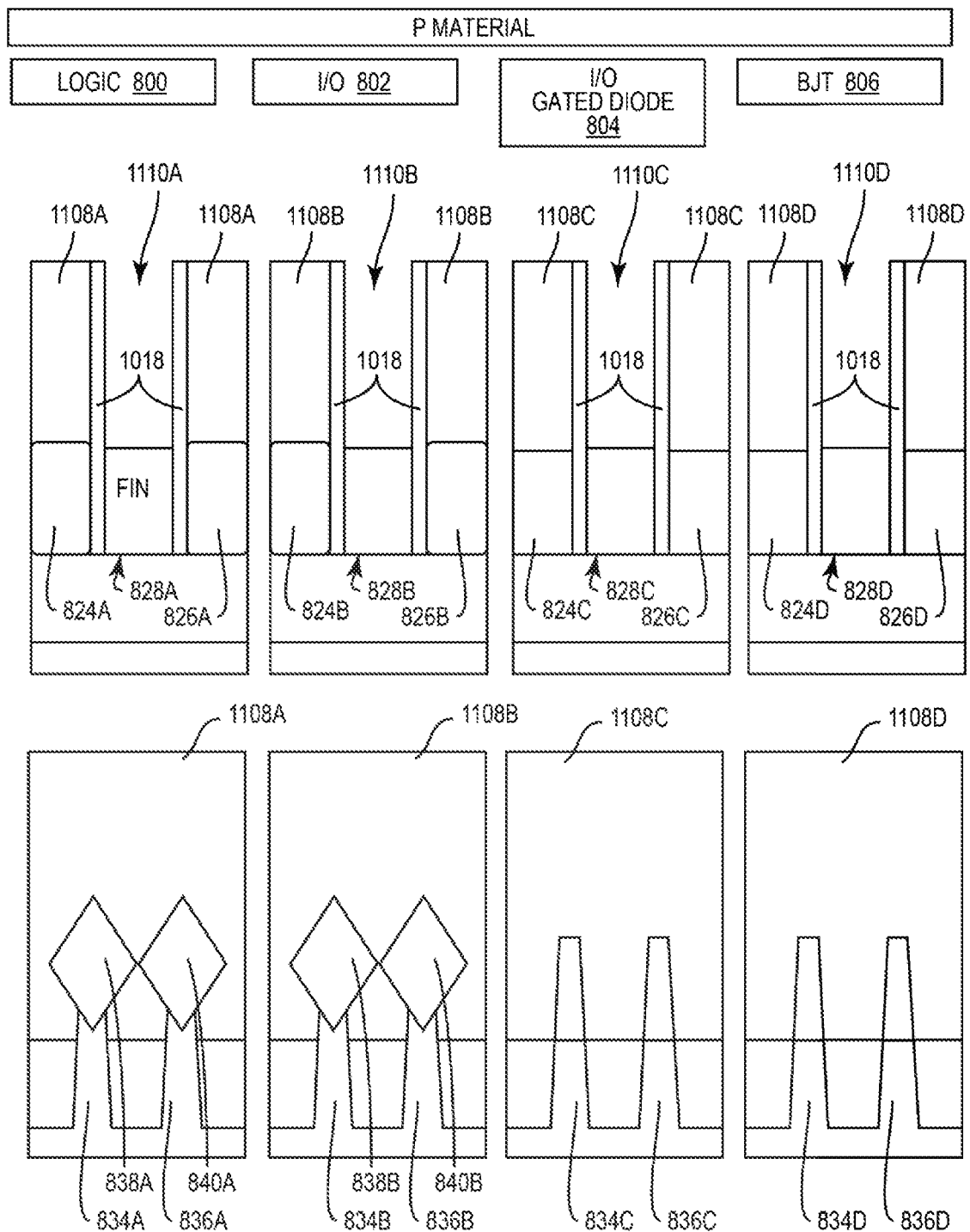
Figure 12E:
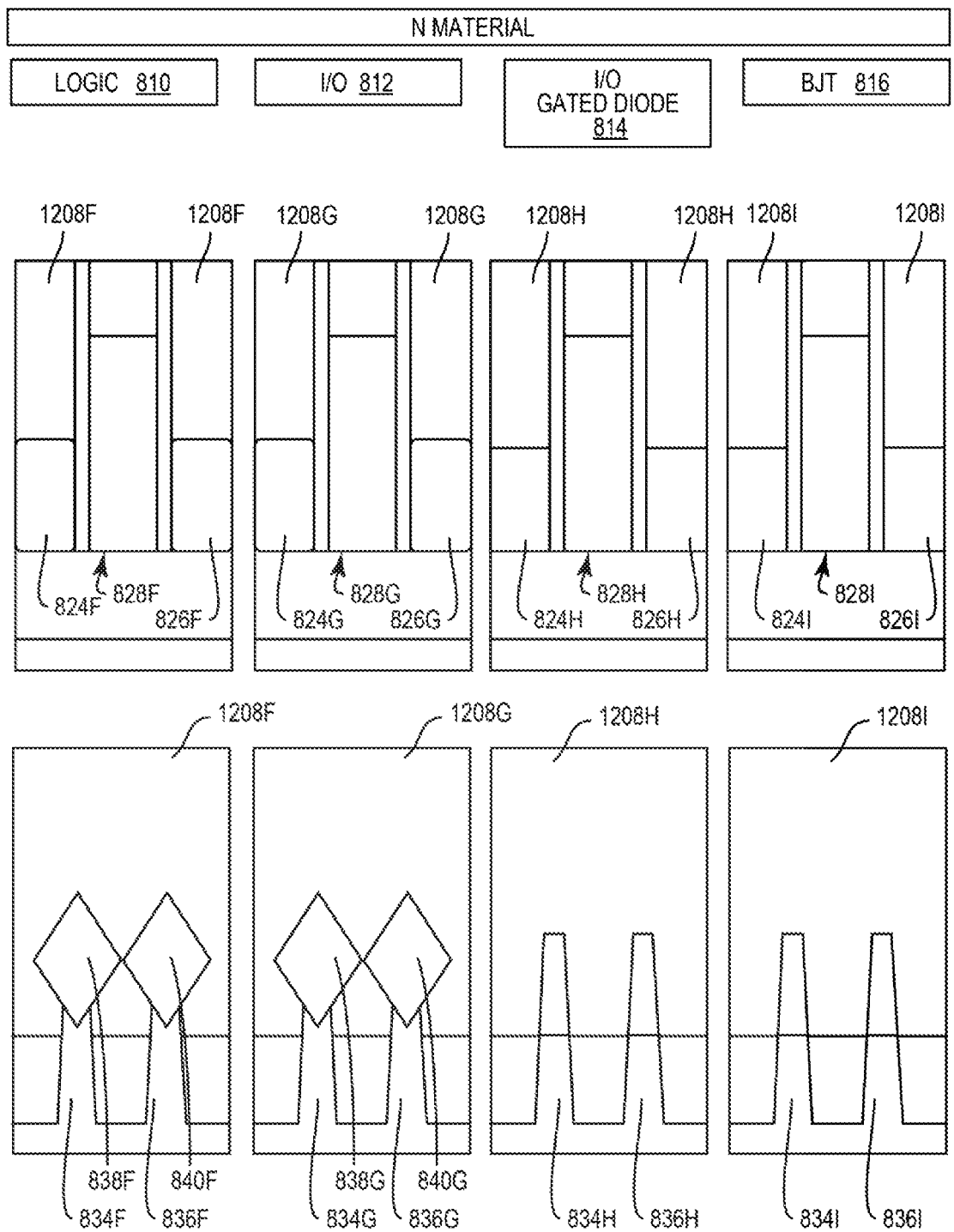
Figure 12F:
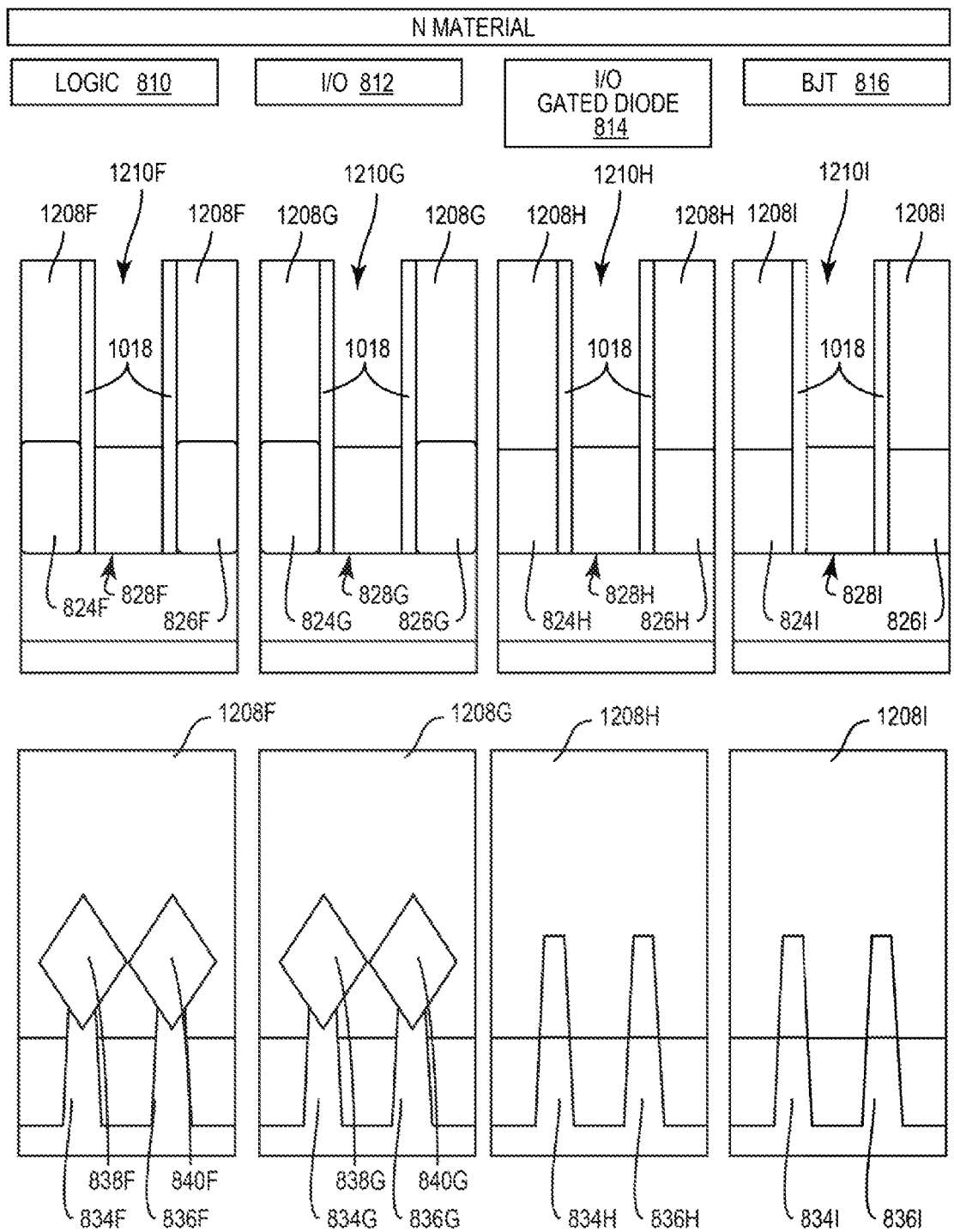

Returning to FIG. 9, the process 900 continues by adding an interlayer dielectric (ILD) material (block 914, see FIGS. 11E and 12E). Specifically, any hardmask is removed, then an ILD material 1108A-1108D and 1208A-1208D is used to fill the space above the source and drain regions 824A-824D, 824F-824I, 826A-826D, and 826F-826I.

The process 900 continues by removing the dummy gates 1012 (block 916, see FIGS. 11F and 12F) creating voids 1110A-1110D and 1210E-1210I. Note that the gate spacers 1018 are left in place.

Figure 11G:
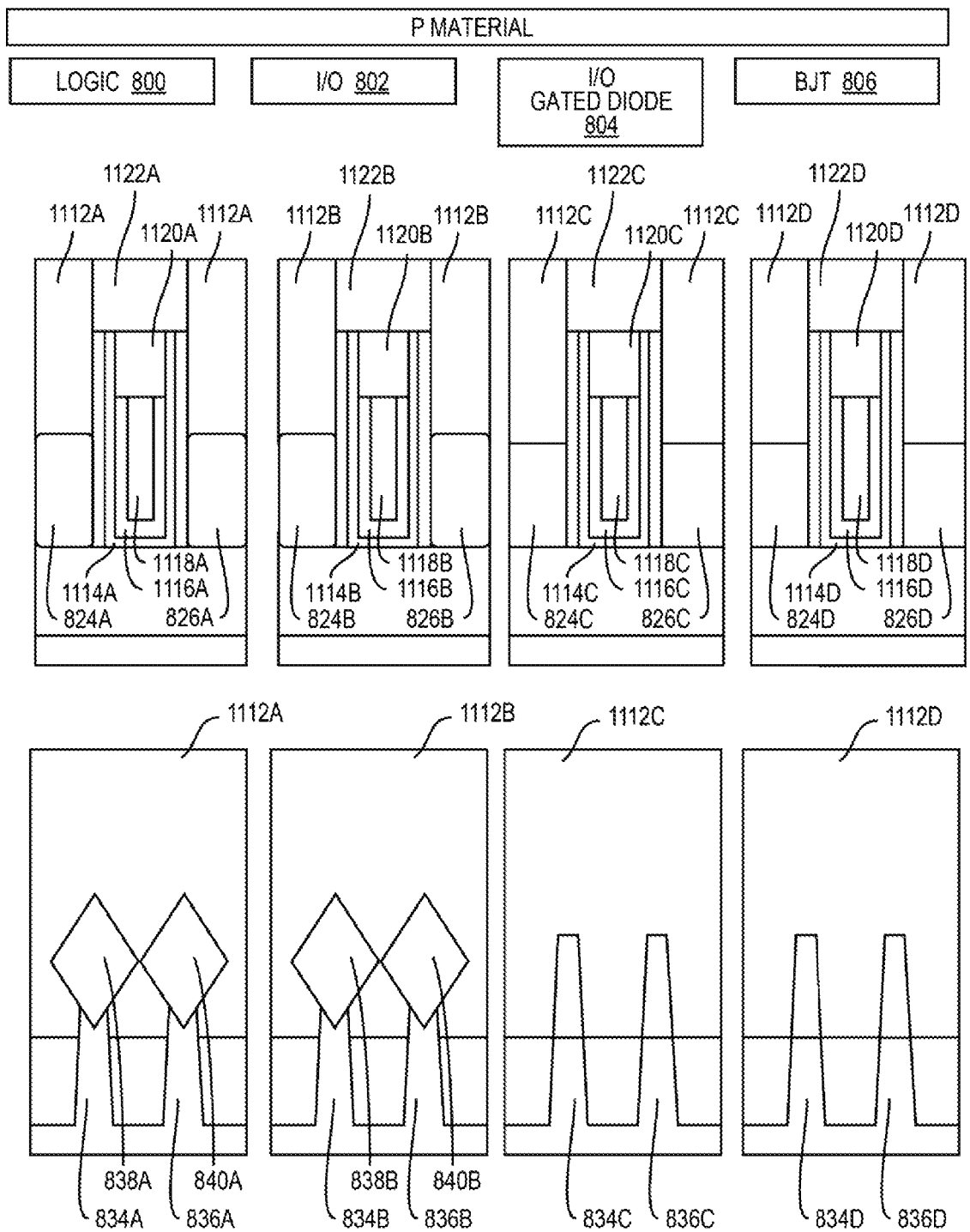
Figure 12G:
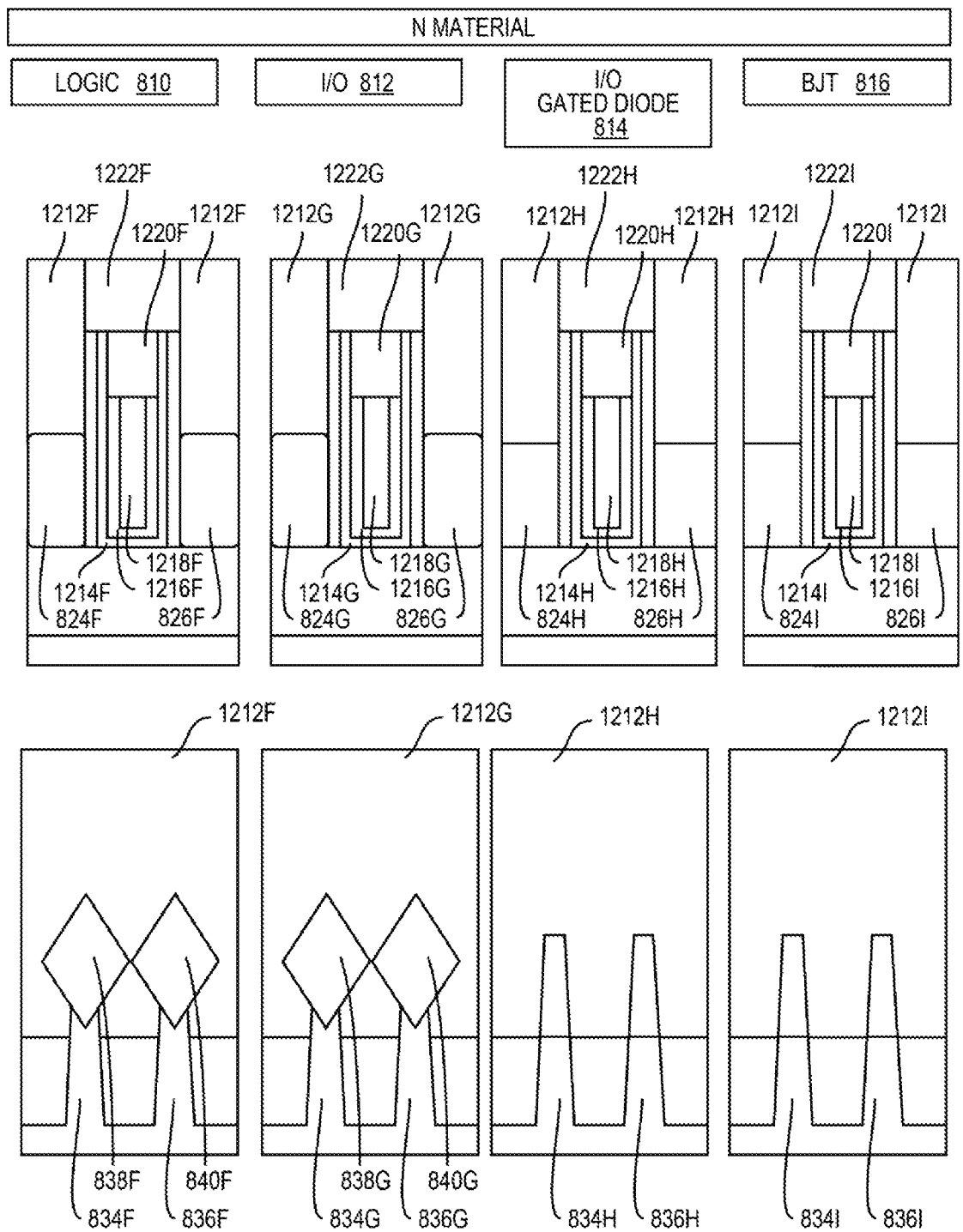

The process 900 continues by adding real metal gates (RMGs) 1112A-1112D and 1212F-1212I (block 918, see FIGS. 11G and 12G). The RMGs 1112A-1112D and 1212F-1212I are formed from a high-k dielectric material 1114A-1114D and 1214F-1214I that is relatively thin and a layer of metal 1116A-1116D and 1216F-1216I. In an exemplary aspect, the layers 1116A-1116D and 1216F-1216I are titanium nitride (TiN). Further, the layers 1116A-1116D are relatively thick compared to the layers 1216F-1216I. Another metal 1118A-1118D and 1218F-1218I is added. This metal may be titanium aluminum carbide (TiAlC). A gate metal 1120A-1120D and 1220E-1220I is also added. The gate metal may be tungsten (W) or cobalt (Co). Capping the gate metal 1120A-1120D and 1220E-1220I may be a self-aligned contact hardmask 1122A-1122D and 1222F-1222I.

Figure 11H:
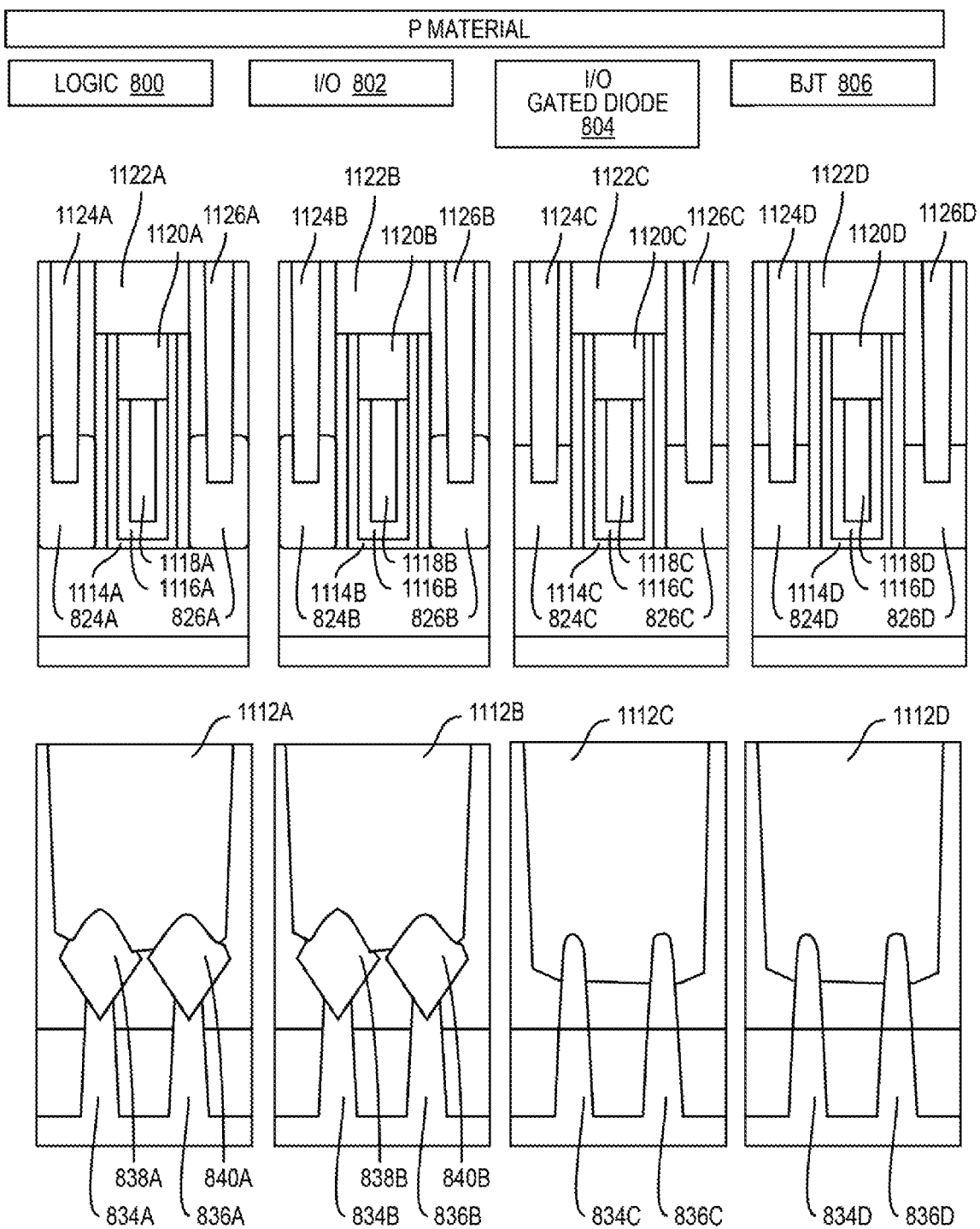
Figure 12H:
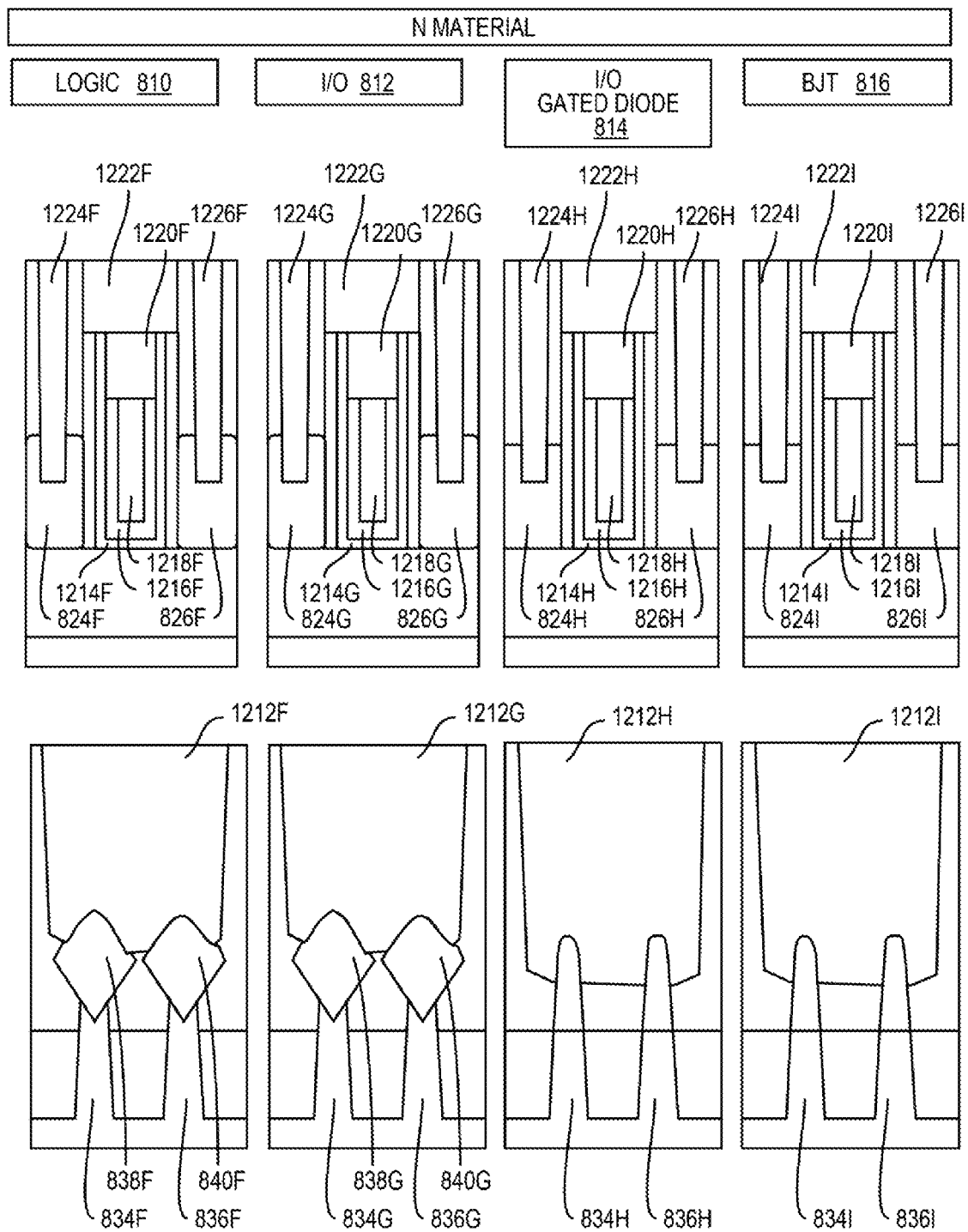

The process 900 continues by adding contacts 1124A-1124D, 1126A-1126D, 1224F-1224I, and 1226F-1226I to each of the elements 800, 802, 804, 806, 810, 812, 814, and 816 (block 920, see FIGS. 11H and 12H). The process 900 concludes with any back end of line (BEOL) processing (block 922).

Note that while the largest improvement in reducing leakage current in the I/O gated diodes 804 and 814 occurs by avoiding using epitaxial growth processes on the associated fins, exemplary aspects of the present disclosure are not so limited. For example, an epitaxial growth may be applied to fins on only one side of the I/O gated diodes 804 and 814 (e.g., just the cathode fins or just the anode fins).

The systems and methods for fabrication of gated diodes with selective epitaxial growth according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 13:
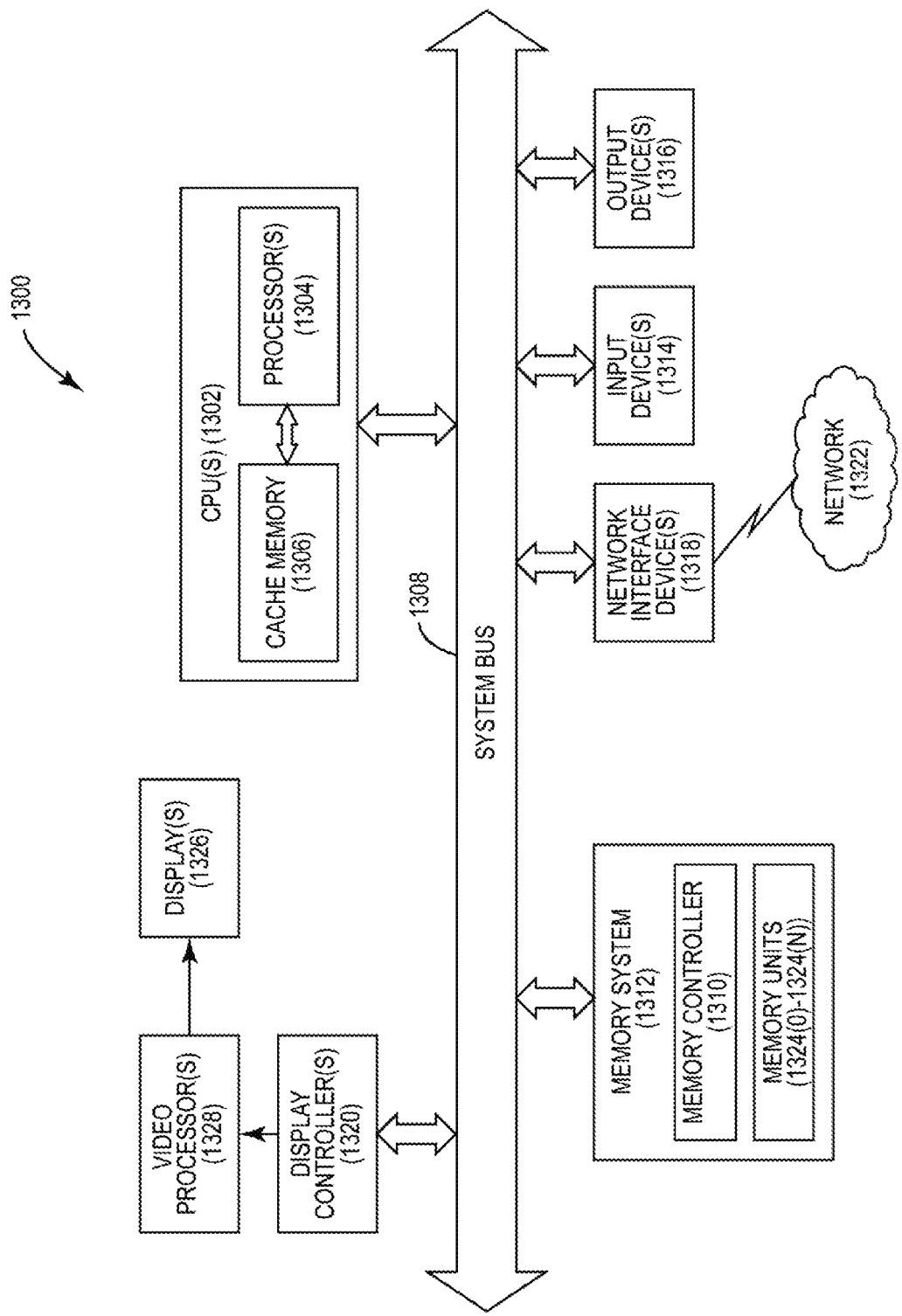
FIG. 13 is a block diagram of an exemplary processor-based system that can include the IC of FIG. 7.

In this regard, FIG. 13 illustrates an example of a processor-based system 1300 that can employ IC 700 illustrated in FIG. 7. In this example, the processor-based system 1300 includes one or more central processing units (CPUs) 1302, each including one or more processors 1304. The CPU(s) 1302 may be a master device. The CPU(s) 1302 may have cache memory 1306 coupled to the processor(s) 1304 for rapid access to temporarily stored data. The CPU(s) 1302 is coupled to a system bus 1308 and can intercouple master and slave devices included in the processor-based system 1300. As is well known, the CPU(s) 1302 communicates with these other devices by exchanging address, control, and data information over the system bus 1308. For example, the CPU(s) 1302 can communicate bus transaction requests to a memory controller 1310 as an example of a slave device. Although not illustrated in FIG. 14, multiple system buses 1308 could be provided, wherein each system bus 1308 constitutes a different fabric.

Other master and slave devices can be connected to the system bus 1308. As illustrated in FIG. 13, these devices can include a memory system 1312, one or more input devices 1314, one or more output devices 1316, one or more network interface devices 1318, and one or more display controllers 1320, as examples. The input device(s) 1314 can include any type of input device, including, but not limited to, input keys, switches, voice processors, etc. The output device(s) 1316 can include any type of output device, including, but not limited to, audio, video, other visual indicators, etc. The network interface device(s) 1318 can be any devices configured to allow exchange of data to and from a network 1322. The network 1322 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1318 can be configured to support any type of communications protocol desired. The memory system 1312 can include one or more memory units 1324(0-N).

The CPU(s) 1302 may also be configured to access the display controller(s) 1320 over the system bus 1308 to control information sent to one or more displays 1326. The display controller(s) 1320 sends information to the display(s) 1326 to be displayed via one or more video processors 1328, which process the information to be displayed into a format suitable for the display(s) 1326. The display(s) 1326 can include any type of display, including, but not limited to, a cathode ray tube (CRT), a liquid crystal display (LCD), a plasma display, a light emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. An integrated circuit (IC) comprising:
    a logic region comprising at least one Field-Effect Transistor (FET), the at least one FET comprising a plurality of FET fins, each of the plurality of FET fins comprising a respective FET fin epitaxial bump; and
    an input/output (I/O) region comprising at least one I/O gated diode, the at least one I/O gated diode comprising a plurality of diode fins, wherein at least one of the plurality of diode fins comprises a source and a drain, and wherein at least one of the source and the drain does not comprise an epitaxial bump.

2. The IC of claim 1, wherein the logic region further comprises a logic gated diode, the logic gated diode comprising a plurality of logic diode fins, each of the plurality of logic diode fins comprising a respective logic diode fin epitaxial bump.

3. The IC of claim 1, wherein the I/O region further comprises an I/O FET, the I/O FET comprising a plurality of I/O FET fins, each of the plurality of I/O FET fins comprising a respective I/O FET fin epitaxial bump.

4. The IC of claim 1, further comprising an electrostatic discharge (ESD) protection circuit, wherein the ESD protection circuit comprises the at least one I/O gated diode.

5. The IC of claim 1, wherein the at least one FET comprises a P-type metal oxide semiconductor (MOS) (PMOS) FET.

6. The IC of claim 5, wherein the at least one FET comprises at least one second FET and the at least one second FET comprises an N-type MOS (NMOS) FET.

7. The IC of claim 1, wherein the respective FET fin epitaxial bump comprises either SiGe or SiP material.

8. The IC of claim 1, wherein the I/O region surrounds the logic region.

9. The IC of claim 1, wherein the I/O region is positioned at a peripheral edge of the IC.

10. The IC of claim 1, wherein both the source and the drain do not comprise an epitaxial bump.

11. The IC of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

12. An integrated circuit (IC) comprising:
    a logic region comprising at least one Field-Effect Transistor (FET), the at least one FET comprising a plurality of FET fins, each of the plurality of FET fins comprising a respective means for shaping a fin; and
    an input/output (I/O) region comprising at least one I/O gated diode, the at least one I/O gated diode comprising a plurality of diode fins, wherein each of the plurality of diode fins comprises a source and a drain, and wherein at least one of the source and drain does not comprise a means for shaping a fin.

13. A method for fabricating an integrated circuit (IC) comprising:
    forming a first fin for a Field-Effect Transistor (FET) in a logic region of an IC;
    forming a second fin for a gated diode in an input/output (I/O) region of the IC;
    forming a bump using an epitaxial growth process on the first fin; and
    not forming an epitaxial bump on at least one of a source or a drain of the second fin.

14. The method of claim 13, further comprising forming a second gated diode in the logic region of the IC.

15. The method of claim 14, further comprising forming a third fin for the second gated diode and forming a second bump using the epitaxial growth process on the second fin.

16. The method of claim 13, wherein forming the first fin comprises etching a substrate.

17. The method of claim 16, further comprising forming a shallow trench isolation (STI) region after etching the substrate.

18. The method of claim 13, further comprising forming a dummy gate proximate the first fin.

19. The method of claim 18, further comprising removing the dummy gate after forming the bump.

20. The method of claim 13, wherein forming the first fin in the logic region comprises forming the logic region surrounded by the I/O region.

21. The method of claim 13, wherein forming the second fin in the I/O region comprises forming the I/O region around a peripheral area of the IC.

* * * * *